US012396329B2

(12) United States Patent
Seo et al.

(10) Patent No.: US 12,396,329 B2
(45) Date of Patent: Aug. 19, 2025

(54) DISPLAY APPARATUS

(71) Applicant: Samsung Display Co., Ltd., Yongin-Si (KR)

(72) Inventors: Youngwan Seo, Yongin-si (KR); Jisun Kim, Yongin-si (KR); Kyunghoe Lee, Yongin-si (KR); Keunhee Choi, Yongin-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 525 days.

(21) Appl. No.: 17/704,095

(22) Filed: Mar. 25, 2022

(65) Prior Publication Data
US 2022/0310736 A1 Sep. 29, 2022

(30) Foreign Application Priority Data

Mar. 26, 2021 (KR) .................. 10-2021-0039779

(51) Int. Cl.
*H10K 59/121* (2023.01)
*H10K 59/12* (2023.01)
*H10K 59/123* (2023.01)
*H10K 59/131* (2023.01)

(52) U.S. Cl.
CPC ..... *H10K 59/1216* (2023.02); *H10K 59/1213* (2023.02); *H10K 59/131* (2023.02)

(58) Field of Classification Search
CPC .......... H10K 59/1216; H10K 59/1213; H10K 59/131; H10K 59/123; H10K 59/121; H10K 59/12; G09G 3/3233; G09G 3/3225; G09G 2300/0876
See application file for complete search history.

(56) References Cited

U.S. PATENT DOCUMENTS

| | | | |
|---|---|---|---|
| 9,165,993 B2 | 10/2015 | Kim | |
| 10,141,387 B2 | 11/2018 | Lius et al. | |
| 10,186,191 B2 | 1/2019 | Kang et al. | |
| 10,263,060 B2 | 4/2019 | Noh et al. | |
| 10,650,739 B2 | 5/2020 | Kim et al. | |
| 2002/0070381 A1* | 6/2002 | Yamada | H01L 21/02686 257/59 |
| 2015/0115253 A1* | 4/2015 | Ha | H10K 59/122 438/23 |
| 2016/0233282 A1* | 8/2016 | Song | H10K 71/00 |
| 2018/0149937 A1* | 5/2018 | Nakajima | H01L 28/60 |
| 2018/0175127 A1* | 6/2018 | Lee | H10D 86/451 |

(Continued)

FOREIGN PATENT DOCUMENTS

| | | |
|---|---|---|
| KR | 1020140120734 A | 10/2014 |
| KR | 10-2017-0065059 A | 6/2017 |

(Continued)

*Primary Examiner* — Herve-Louis Y Assouman
(74) *Attorney, Agent, or Firm* — Innovation Counsel LLP

(57) ABSTRACT

A display apparatus includes: a substrate including a first area and a second area disposed adjacent to the first area; a first pixel arranged in the first area; a first pixel circuit arranged in the first area, electrically connected to the first pixel, and overlapping at least a portion of the first pixel; and a second pixel arranged in the second area and electrically connected to the first pixel circuit, wherein the first pixel circuit includes a first storage capacitor and a second storage capacitor that are connected in parallel to each other.

16 Claims, 15 Drawing Sheets

(56) References Cited

U.S. PATENT DOCUMENTS

2018/0182836 A1\* 6/2018 Beak .................. H10K 59/1216
2019/0189723 A1\* 6/2019 Kim ..................... H10K 77/111
2022/0013611 A1   1/2022 Park et al.

FOREIGN PATENT DOCUMENTS

| KR | 10-2018-0012442 A | 2/2018 |
| KR | 10-2018-0112158 A | 10/2018 |
| KR | 10-2126552 B1 | 6/2020 |
| KR | 10-2177587 B1 | 11/2020 |
| KR | 10-2022-0006682 A | 1/2022 |

\* cited by examiner

FIG. 15

| CAPACITANCE(F) | DRIVING CURRENT | | |
|---|---|---|---|
| | RED LIGHT(A) | GREEN LIGHT(A) | BLUE LIGHT(A) |
| 63.25F | $3.24 \times 10^{-8}$ | $1.26 \times 10^{-8}$ | $4.73 \times 10^{-8}$ |
| 70F | $3.85 \times 10^{-8}$ | $1.58 \times 10^{-8}$ | $6.32 \times 10^{-8}$ |
| 80F | $4.95 \times 10^{-8}$ | $2.12 \times 10^{-8}$ | $7.94 \times 10^{-8}$ |
| 90F | $6.10 \times 10^{-8}$ | $2.70 \times 10^{-8}$ | $9.62 \times 10^{-8}$ |
| 100F | $7.29 \times 10^{-8}$ | $3.31 \times 10^{-8}$ | $1.13 \times 10^{-7}$ |
| 110F | $8.50 \times 10^{-8}$ | $3.94 \times 10^{-8}$ | $1.31 \times 10^{-7}$ |
| 120F | $9.71 \times 10^{-8}$ | $4.58 \times 10^{-8}$ | $1.48 \times 10^{-7}$ |
| 130F | $1.09 \times 10^{-7}$ | $5.22 \times 10^{-7}$ | $1.65 \times 10^{-7}$ |

DISPLAY APPARATUS

CROSS-REFERENCE TO RELATED APPLICATION

This application is based on and claims priority under 35 U.S.C. § 119 to Korean Patent Application No. 10-2021-0039779, filed on Mar. 26, 2021, in the Korean Intellectual Property Office, the disclosure of which is incorporated by reference herein in its entirety.

BACKGROUND

1. Field

One or more embodiments relate to an apparatus, and more particularly, to a display apparatus.

2. Description of the Related Art

Generally, a display apparatus includes a display element and electronic elements configured to control an electric signal applied to the display element. The electronic elements include a thin-film transistor, a storage capacitor, and a plurality of wirings.

Recently, the usage of display apparatuses has diversified. In addition, as display apparatuses have become thinner and lighter, their range of use has gradually been extended. As the usage of display apparatuses has diversified, various methods have been studied in designing the shape of the display apparatuses.

SUMMARY

However, in a display apparatus according to the related art, in the case where a plurality of pixels are driven by using one pixel circuit, the resolution of the display apparatus has been reduced.

One or more embodiments include a display apparatus in which resolution thereof is not reduced even when a plurality of pixels are driven by using one pixel circuit. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate including a first area and a second area disposed adjacent to the first area, a first pixel arranged in the first area, a first pixel circuit arranged in the first area, electrically connected to the first pixel, and overlapping at least a portion of the first pixel, and a second pixel arranged in the second area and electrically connected to the first pixel circuit, wherein the first pixel circuit includes a first storage capacitor and a second storage capacitor that are connected in parallel to each other.

The first storage capacitor may include a first electrode and a second electrode which overlap each other with at least one insulating layer interposed therebetween.

The second storage capacitor may include the second electrode and a third electrode which overlap each other with at least one insulating layer interposed therebetween.

The first electrode may be electrically connected to the third electrode.

The first pixel circuit may include a first thin-film transistor including a first gate electrode and a first semiconductor layer, the first gate electrode being arranged in a same layer as the first electrode and the first semiconductor layer being arranged below the first gate electrode, and a second thin-film transistor including a second gate electrode and a second semiconductor layer, the second gate electrode being arranged in a same layer as the third electrode and the second semiconductor layer being arranged below the second gate electrode.

The second thin-film transistor may further include a third gate electrode arranged below the second semiconductor layer.

The first semiconductor layer and the second semiconductor layer may be arranged in different layers.

The first semiconductor layer may include a silicon semiconductor and the second semiconductor layer may include an oxide semiconductor.

The third electrode may be electrically connected to the second semiconductor layer through a connection electrode.

The first pixel circuit may further include a third storage capacitor and the third storage capacitor may include a fourth electrode and a fifth electrode which overlap each other with at least one insulating layer therebetween.

The fourth electrode may be arranged in a same layer as the first electrode and the fifth electrode may be arranged in a same layer as the second semiconductor layer.

The second pixel may not overlap the first pixel circuit.

The second pixel may be connected to the first pixel circuit through a connection wiring.

The display apparatus may further include a third pixel arranged in the first area, and a second pixel circuit arranged in the first area, electrically connected to the third pixel, and overlapping at least a portion of the third pixel.

According to one or more embodiments, a display apparatus includes a substrate including a first area and a second area disposed adjacent to the first area, and a first pixel circuit arranged in the first area and including a first semiconductor layer and a second semiconductor layer arranged in different layers, wherein the first pixel circuit includes a first storage capacitor and a second storage capacitor which are connected in parallel to each other.

The display apparatus may further include a first pixel arranged in the first area, wherein the first pixel may be electrically connected to the first pixel circuit and may overlap at least a portion of the first pixel circuit.

The display apparatus may further include a second pixel arranged in the second area, wherein the second pixel may be electrically connected to the first pixel circuit and the second pixel may not overlap the first pixel circuit.

The display apparatus may further include a third pixel arranged in the first area and a second pixel circuit electrically connected to the third pixel, wherein the third pixel may overlap at least a portion of the second pixel circuit.

The first storage capacitor may include a first electrode and a second electrode which overlap each other with at least one insulating layer interposed therebetween, and the second storage capacitor may include the second electrode and a third electrode which overlap each other with at least one insulating layer interposed therebetween.

The first semiconductor layer may include a silicon semiconductor and the second semiconductor layer may include an oxide semiconductor.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 15 is a table showing measurement results of a current (driving current) according to a capacitance of a storage capacitor.

DETAILED DESCRIPTION

Figure 1:
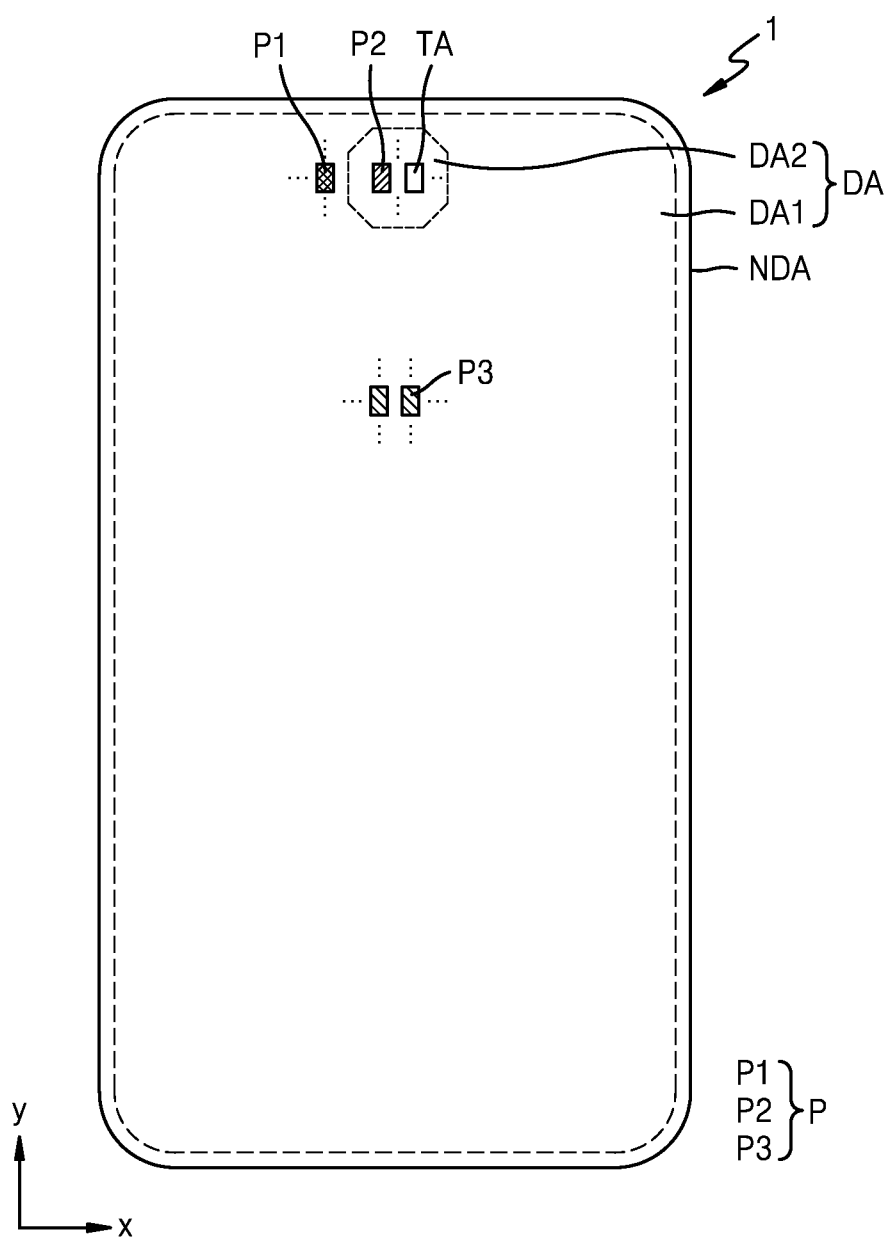
FIG. 1 is a plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the present specification, "A and/or B" means A or B, or A and B. In the present specification, "at least one of A and B" means A or B, or A and B.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a certain process order may be performed differently from the described order. For example, two consecutively described processes may be performed substantially at the same time or performed in an order opposite to the described order.

A display apparatus described with reference to the drawings may include an apparatus for displaying moving images or still images and may be used as a display screen of various products including televisions, notebook computers, monitors, advertisement boards, Internet of things (IoT) as well as portable electronic apparatuses including mobile phones, smart phones, tablet personal computers (PCs), mobile communication terminals, electronic organizers, electronic books, portable multimedia players (PMPs), navigations, and ultra mobile personal computers (UMPCs). In addition, the display apparatus according to an embodiment may be used in wearable devices including smartwatches, watch-phones, glasses-type displays, and head-mounted displays (HMD). In addition, the display apparatus according to an embodiment may be used as instrument panels for automobiles, center fascias for automobiles, or center information displays (CID) arranged on a dashboard, room mirror displays that replace side mirrors of automobiles, and displays arranged on the backside of front seats as an entertainment for back seats of automobiles.

FIG. 1 is a plan view of a display apparatus 1 according to an embodiment.

Referring to FIG. 1, the display apparatus 1 may include a display area DA and a peripheral area NDA outside the display area DA. The display area DA may include a first area DA1 and a second area DA2, the first area DA1 being defined as a main display area, and the second area DA2 being defined as an auxiliary display area or a component area. In an embodiment, the second area DA2 may contact at least a portion of the first area DA1.

The display apparatus 1 may display an image through a plurality of pixels P arranged in the display area DA. In an embodiment, a plurality of pixels P may include first pixels P1, third pixels P3, and second pixels P2, the first pixels P1 and the third pixels P3 being arranged in the first area DA1, and the second pixels P2 being arranged in the second area DA2 disposed to surround the first area DA1. The first area DA1 and the second area DA2 may display an image individually or in cooperation with each other. In this case, as described below, the first pixel P1 may denote a pixel that shares a pixel circuit with another pixel which is disposed in the second area DA2, and the third pixel P3 may denote a pixel that does not share a pixel circuit with another pixel. In addition, the second pixel P2 is a pixel that does not include a pixel circuit in the second area DA2 and may be driven by a pixel circuit disposed in the first area DA1. That is, a pixel circuit of the first pixel P1 may be configured to drive a plurality of pixels disposed in the first area DA1 and the second area DA2. As an example, a pixel circuit of the first pixel P1 may be configured to simultaneously drive one first pixel P1 and at least one second pixel disposed int the second area DA2. However, the embodiment is not limited thereto.

In an embodiment, the size of the first pixel P1 in the first area DA1 may be the same as the size of the third pixel P3 in the first area DA1. However, the embodiment is not limited thereto. As an example, the size of the first pixel P1 in the first area DA1 may be different from the size of the third pixel P3 in the first area DA1.

In an embodiment, the size of the first pixel P1 in the first area DA1 may be the same as the size of the second pixel P2 in the second area DA2. However, the embodiment is not limited thereto. As an example, the size of the first pixel P1 in the first area DA1 may be different from the size of the second pixel P2 in the second area DA2.

The peripheral area NDA may be a non-display area in which display elements are not arranged. The display area DA may be entirely surrounded by the peripheral area NDA. A driver, etc. may be arranged in the peripheral area NDA, the driver, etc. being configured to provide electric signals or power to the first pixels P1, the second pixels P2, and the third pixels P3. A pad may be arranged in the peripheral area NDA, an electronic element or a printed circuit board, etc. being electrically connected to the pad.

Figure 4:
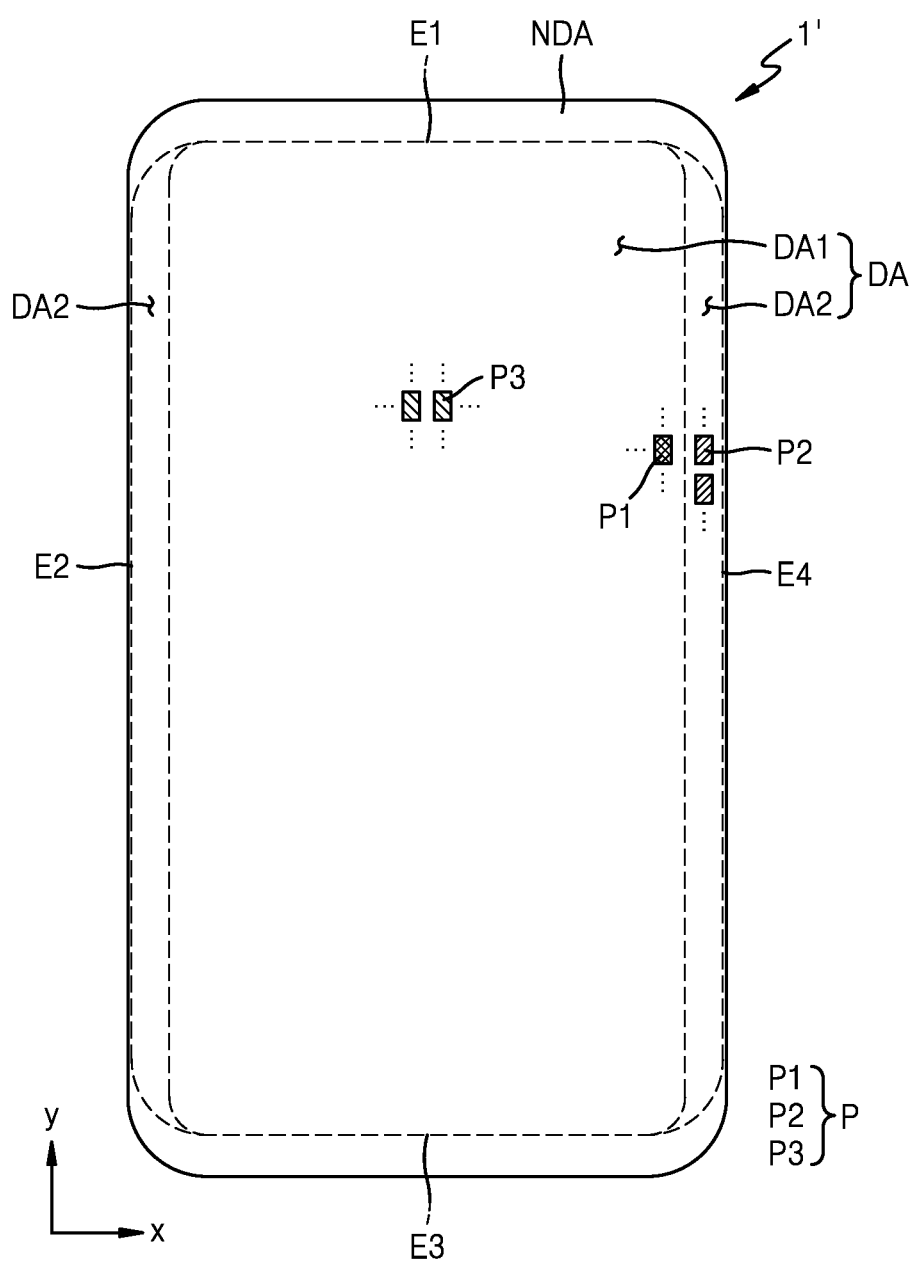
FIG. 4 is a plan view of a display apparatus according to an embodiment.

It is shown in FIG. 1 that one second area DA2 is arranged to be surrounded by the first area DA1. In an embodiment, the display apparatus 1 may include two or more second areas DA2 as shown in FIG. 4, and the shapes and the sizes of the plurality of second areas DA2 may be the same or different from each other. In an embodiment, a ratio of the second area DA2 to the display area DA may be less than a ratio of the first area DA1 to the display area DA.

In an embodiment, in a view in a direction approximately perpendicular to the upper surface of the display apparatus 1, the shape of the second area DA2 may be a shape that is close to an approximately octagon as shown in FIG. 1. However, the embodiment is not limited thereto. As an example, the second area DA2 may have various shapes such as a polygon such as a hexagon, a circular shape, an elliptical shape, a star shape, or a diamond shape. Alternatively, the second area DA2 may have a bar-type quadrangular shape.

In addition, though it is shown in FIG. 1 that, in a view in a direction approximately perpendicular to the upper surface of the display apparatus 1, the second area DA2 is arranged at the upper center (a +y-direction) of the display area DA having a quadrangular shape including approximately round edges. However, embodiment is not limited thereto. As an example, the second area DA2 may be arranged on one side of the display area DA, for example, an upper right side or an upper left side of the display area DA.

In an embodiment, the second area DA2 may include a transmission area TA arranged between adjacent second pixels P2. The transmission area TA is a region through which light may pass. Pixels may not be arranged in the transmission area TA.

In an embodiment, the second pixels P2 may be arranged in the second area DA2. Each second pixel P2 may include at least one sub-pixel and be implemented by a display element such as an organic light-emitting diode OLED. The second pixel P2 may emit, for example, red, green, blue, or white light.

In an embodiment, the transmission area TA may be arranged to surround the second pixels P2. Alternatively, the transmission areas TA may be alternately arranged with the second pixels P2.

Because the second area DA2 includes the transmission area TA, the resolution of the second area DA2 may be less than the resolution of the first area DA1. As an example, the resolution of the second area DA2 may be about ½, about ⅜, about ⅓, about ¼, about ⅖, about ⅛, about ⅑, or about ¹⁄₁₆. As an example, the resolution of the second area DA2 may be about 200 ppi or about 100 ppi, and the resolution of the first area DA1 may be 400 ppi or more.

In an embodiment, the first pixels P1 and the third pixels P3 may be arranged in the first area DA1. Each of the first pixel P1 and the third pixel P3 may include at least one sub-pixel and be implemented by a display element such as an organic light-emitting diode OLED. Each of the first pixel P1 and the third pixel P3 may emit, for example, red, green, blue, or white light.

As described below with reference to FIG. 2, a component 20 (see FIG. 2), which is an electronic element, may be arranged below the display apparatus 1 to correspond to the second area DA2.

Hereinafter, though an organic light-emitting display apparatus is described as an example of the display apparatus 1 according to an embodiment, the display apparatus 1 according to an embodiment is not limited thereto. In an embodiment, the display apparatus 1 may be an inorganic light-emitting display or a quantum-dot light-emitting display. As an example, an emission layer of a display element of the display apparatus 1 may include an organic material, an inorganic material, quantum dots, an organic material and quantum dots, or an inorganic material and quantum dots.

Figure 2:
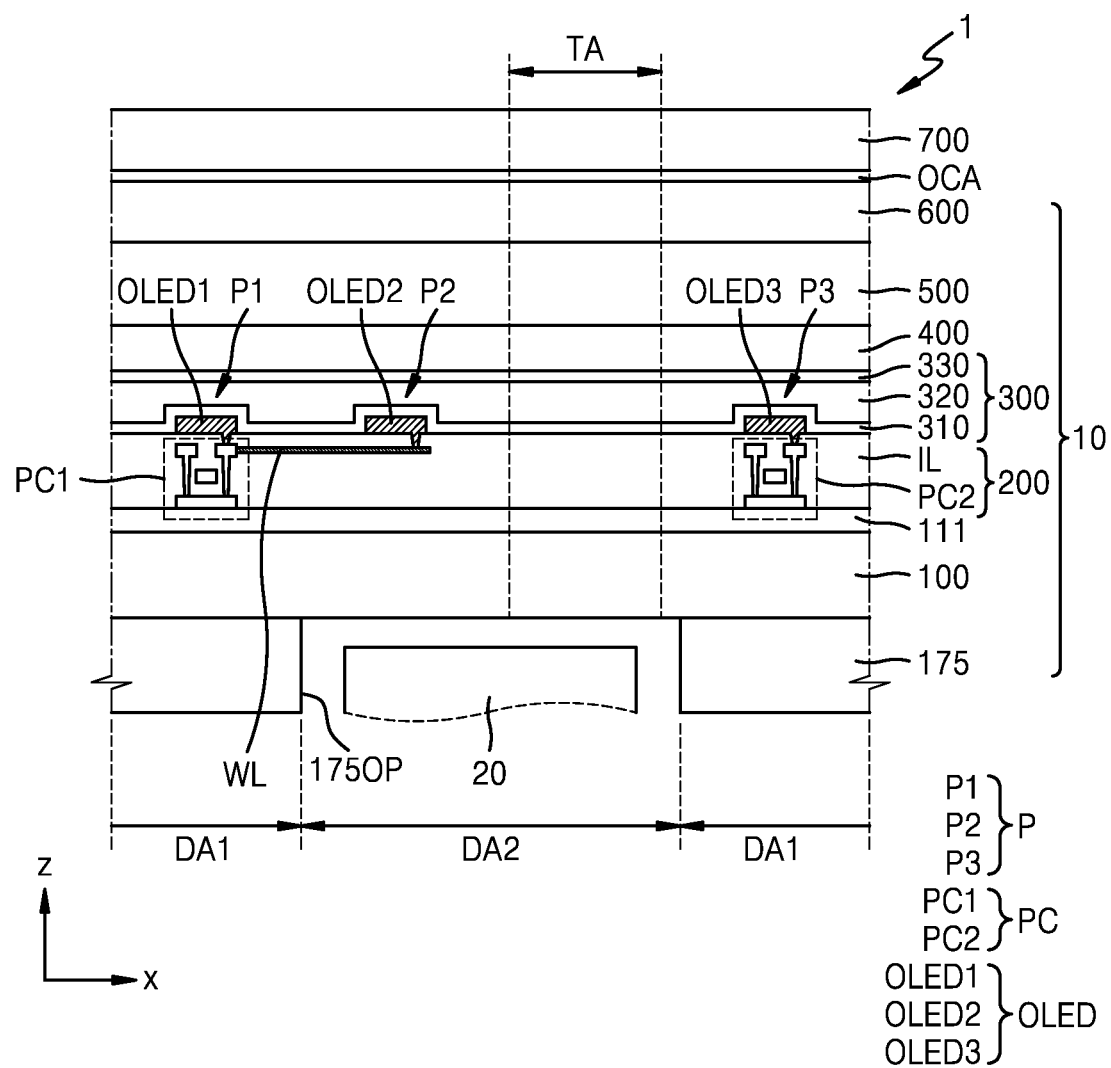
FIG. 2 is a cross-sectional view of a display apparatus according to an embodiment.

FIG. 2 is a cross-sectional view of the display apparatus 1 according to an embodiment.

Referring to FIG. 2, the display apparatus 1 may include a display panel 10 and the component 20 disposed below the display panel 10.

In an embodiment, the display apparatus 1 may include the display panel 10 and a cover window 700 disposed on the display panel 10, the display panel 10 including a substrate 100, a display layer 200 on the substrate 100, a thin-film encapsulation layer 300, an input sensing layer 400, an optical functional layer 500, and an anti-reflection layer 600 on the display layer 200.

In an embodiment, the component 20 may be arranged in the second area DA2. The component 20 may be an electronic element that uses light or sound. As an example, the electronic element may be a sensor that measures a distance such as a proximity sensor, a sensor that recognizes a portion of a user's body (e.g. a fingerprint, an iris, or a face), a small lamp that outputs light, or an image sensor (e.g. a camera) that captures an image. The electronic element that uses light may use light in various wavelength bands such as visible light, infrared light, or ultraviolet light. The electronic element that uses light may use ultrasonic waves or sound in different frequency bands. In an embodiment, the component 20 may include sub-components such as a light-emitter and a light-receiver. The light-emitter and the light-receiver may have an integrated structure, or a pair of light-emitter and light-receiver having physically separated structures may constitute one component 20.

The substrate 100 may include glass or a polymer resin. As an example, the substrate 100 may include a polymer resin including polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 including a polymer resin is flexible, rollable, or bendable. The substrate 100 may have a multi-layered structure including a layer including the polymer resin and an inorganic layer (not shown).

The display layer 200 may be arranged on the front surface of the substrate 100, and a bottom protection film 175 may be arranged on the back surface of the substrate 100. The bottom protection film 175 may be attached to the back surface of the substrate 100. An adhesive layer may be arranged between the bottom protection film 175 and the substrate 100. Alternatively, the bottom protection film 175 may be directly formed on the back surface of the substrate 100. In this case, an adhesive layer is not arranged between the bottom protection film 175 and the substrate 100.

The bottom protection film 175 may support and protect the substrate 100. The bottom protection film 175 may include an opening 175OP corresponding to the second area DA2. The opening 175OP of the bottom protection film 175 is a concave portion formed by removing a portion of the bottom protection film 175 in a thickness direction. In an embodiment, the opening 175OP of the bottom protection film 175 may be formed by entirely removing a portion of the bottom protection film 175 in the thickness direction. In this case, the opening 175OP may have a shape of a through hole as shown in FIG. 2. In an embodiment, the opening 175OP of the bottom protection film 175 may have a shape of a blind hole having a recess shape that does not completely pass through the bottom protection film 175 while a portion of the bottom protection film 175 is removed in the thickness direction.

Because the bottom protection film 175 includes the opening 175OP, a transmittance of the second area DA2, for example, a light transmittance of the transmission area TA may be improved. The bottom protection film 175 may include an organic insulating material such as polyethylene terephthalate or polyimide.

The display layer 200 may include a plurality of pixels P. The display layer 200 may include a display element layer, a circuit layer, and an insulating layer IL, the display element layer including an organic light-emitting diode OLED, which is a display element, and the circuit layer including a pixel circuit PC electrically connected to the organic light-emitting diode OLED.

In an embodiment, a first pixel circuit PC1 and a first organic light-emitting diode OLED1 may be arranged in the first area DA1, the first organic light-emitting diode OLED1 being electrically connected to the first pixel circuit PC1. In addition, a second pixel circuit PC2 and a third organic light-emitting diode OLED3 may be arranged in the first area DA1, the third organic light-emitting diode OLED3 being electrically connected to the second pixel circuit PC2. In an embodiment, a second organic light-emitting diode OLED2 may be arranged in the second area DA2. The second organic light-emitting diode OLED2 may be electrically connected to the first pixel circuit PC1 arranged in the first area DA1. As an example, the first pixel circuit PC1 arranged in the first area DA1 may be electrically connected to the second organic light-emitting diode OLED2 arranged in the second area DA2 through a connection wiring WL. Each pixel circuit PC may include a transistor and a storage capacitor.

The second area DA2 may include a transmission area TA in which the pixel circuit PC and the organic light-emitting diode OLED are not arranged. The transmission area TA is a region through which light emitted from and progressing to the component 20 may pass. In the display apparatus 1, a transmittance of the transmission area TA may be about 30% or more, about 40% or more, about 50% or more, about 60% or more, about 70% or more, about 75% or more, about 80% or more, about 85% or more, or about 90% or more.

Though not shown, a bottom metal layer may be arranged between the substrate 100 and the display layer 200, for example, between the substrate 100 and the pixel circuit PC. The bottom metal layer may include a through hole through which light emitted from or progressing to the component 20 may pass. The through hole of the bottom metal layer may be arranged in the transmission area TA. A portion of the bottom metal layer in which the through hole is not formed may prevent light from being diffracted through the pixel circuit PC or a narrow gap between wirings connected to the pixel circuit PC arranged in the second area DA2, and thus, the performance of a transistor of the pixel circuit PC may be improved. There may not be a portion of the bottom metal layer in the transmission area TA. As an example, the bottom metal layer may include a hole(s) defined corresponding to the transmission area TA.

The display layer 200 may be sealed by an encapsulation member. In an embodiment, the encapsulation member may include the thin-film encapsulation layer 300 as shown in FIG. 2. The thin-film encapsulation layer 300 may include at least one inorganic layer and at least one organic layer. In an embodiment, the thin-film encapsulation layer 300 may include a first inorganic layer 310, a second inorganic layer 330, and an organic layer 320 disposed therebetween.

Though not shown, in an embodiment, the encapsulation member may include an encapsulation substrate. The encapsulation substrate may be arranged to face the substrate 100 with the display layer 200 disposed therebetween. There may be a gap between the encapsulation substrate and the display layer 200. The encapsulation substrate may include glass. Sealant may be arranged between the substrate 100 and the encapsulation substrate. Sealant may be arranged in the peripheral area NDA described above with reference to FIG. 1. Sealant arranged in the peripheral area NDA may prevent moisture from penetrating to the display apparatus 1 through the lateral surface of the display apparatus 1 while surrounding the display area DA.

The input sensing layer 400 may obtain coordinate information corresponding to an external input, for example, a touch event of a finger or an object such as a stylus pen. The input sensing layer 400 may include a touch electrode and trace lines connected to the touch electrode. The input sensing layer 400 may sense an external input through a mutual capacitive method or a self-capacitive method.

The input sensing layer 400 may be formed on the encapsulation member. Alternatively, the input sensing layer 400 may be formed separately, and then coupled to the encapsulation member through an adhesive layer such as an optically clear adhesive OCA. In an embodiment, as shown in FIG. 2, the input sensing layer 400 may be directly formed on the thin-film encapsulation layer 300. In this case, an adhesive layer may not be arranged between the input sensing layer 400 and the thin-film encapsulation layer 300.

The optical functional layer 500 may improve a light efficiency. As an example, the optical functional layer 500 may improve a front light efficiency of light emitted from an organic light-emitting diode OLED and/or lateral visibility and reduce or prevent diffraction of light progressing toward the component 20 beyond the transmission area TA.

The anti-reflection layer 600 may reduce the reflectivity of light (external light) incident toward the display apparatus 1 from the outside.

In an embodiment, the anti-reflection layer 600 may include an optical plate including a retarder and/or a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement.

In an embodiment, the anti-reflection layer 600 may include a filter plate including a black matrix and color filters. The filter plate may include color filters, a black matrix, and an overcoat layer arranged for each pixel.

In an embodiment, the anti-reflection layer 600 may include a destructive interference structure. The destructive interference structure may include a first reflection layer and a second reflection layer respectively arranged on different layers. First-reflected light and second-reflected light respectively reflected by the first reflection layer and the second reflection layer may create destructive-interference and thus the reflectivity of external light may be reduced.

The cover window 700 may be arranged on the display panel 10. The cover window 700 may be arranged over the anti-reflection layer 600 and coupled to the anti-reflection layer 600 through an adhesive layer such as an optically clear adhesive OCA. Though it is shown in FIG. 2 that the cover window 700 is arranged on the anti-reflection layer 600, the positions of the anti-reflection layer 600 and the optical functional layer 500 may be exchanged with each other in another embodiment. In this case, the cover window 700 may be coupled to the optical functional layer 500 through an adhesive layer such as an optically clear adhesive OCA. In an embodiment, an optically clear adhesive OCA may be omitted between the cover window 700 and a layer (e.g. the anti-reflection layer or the optical functional layer) below the cover window 700.

One component 20 may be arranged in the second area DA2 or a plurality of components 20 may be arranged in the second area DA2. In the case where the display apparatus 1 includes the plurality of components 20, the display apparatus 1 may include the number of second areas DA2 corresponding to the number of components 20. As an example, the display apparatus 1 may include a plurality of second areas DA2 spaced apart from each other. In an embodiment, the plurality of components 20 may be arranged in one second area DA2.

Figure 3:
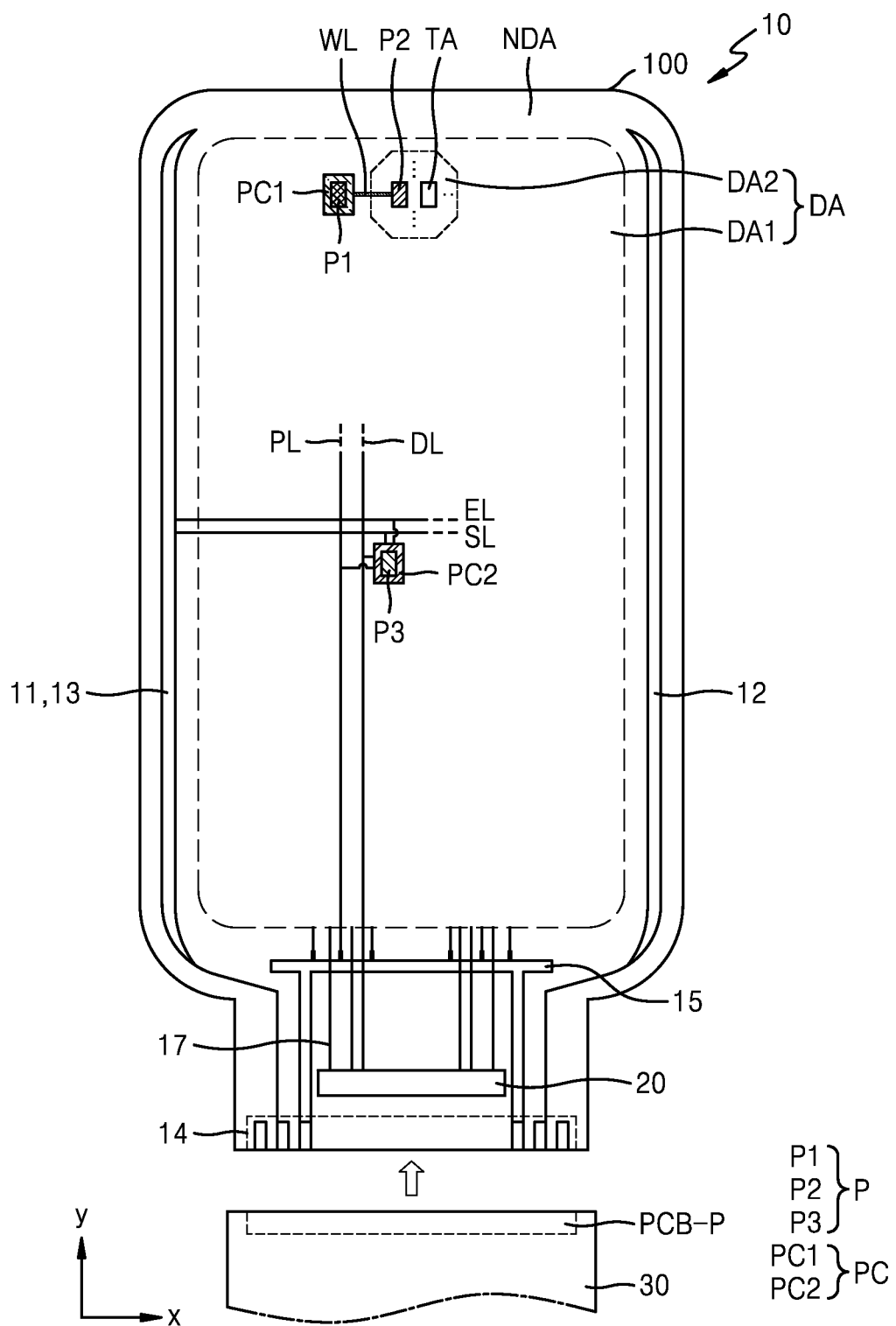
FIG. 3 is a plan view of a display panel of the display apparatus of FIG. 1.

FIG. 3 is a plan view of a display panel of the display apparatus of FIG. 1.

Referring to FIG. 3, the display apparatus 1 may include the substrate 100. In an embodiment, various kinds of elements constituting the display apparatus 1 may be arranged on the substrate 100. As an example, various kinds of elements constituting the display panel 10 may be arranged on the substrate 100.

The substrate 100 may include the display area DA and the peripheral area NDA surrounding the display area DA. The display area DA may include the first area DA1 and the second area DA2, the first area DA1 being configured to display a main image, and the second area DA2 being configured to display an auxiliary image. First pixels P1 and third pixels P3 may be arranged in the first area DA1. Second pixels P2 may be arranged in the second area DA2. Each of the first pixel P1, the second pixel P2, and/or the third pixel P3 may include at least one sub-pixel and be implemented by a display element such as an organic light-emitting diode OLED. The first pixel P1, the second pixel P2, and/or the third pixel P3 may emit, for example, red, green, blue, or white light.

The second area DA2 may be arranged on one side of the first area DA1 as described above, or may be arranged inside the display area DA and completely surrounded by the first area DA1. The second pixels P2 may be arranged in the second area DA2. Each second pixel P2 may be implemented by a display element such as an organic light-emitting diode OLED.

In an embodiment, the pixel circuit PC configured to drive the second pixel P2 may not be arranged in the second area DA2 but is arranged in the first area DA1 disposed adjacent to the second area DA2. As an example, the first pixel circuit PC1 configured to drive the second pixel P2 may be arranged in the first area DA1. In an embodiment, the first pixel circuit PC1 may overlap at least a portion of the first pixel P1. As an example, the first pixel circuit PC1 may be electrically connected to the first pixel P1, and thus, may drive the first pixel P1. In addition, the first pixel circuit PC1 may be electrically connected to the second pixel P2 arranged in the second area DA2, and thus, may drive the second pixel P2. As an example, the first pixel circuit PC1 arranged in the first area DA1 may be electrically connected to the second pixel P2 arranged in the second area DA2 through a connection wiring WL. That is, one first pixel circuit PC1 may be configured to drive at least two pixels P which are disposed in the first area DA1 and the second area DA2.

The pixel circuit PC arranged in the display area DA may be electrically connected to outer circuits arranged in the peripheral area NDA which is a non-display area. A first scan driving circuit 11, a second scan driving circuit 12, an emission control driving circuit 13, a terminal 14, and a first power supply line 15 may be arranged in the peripheral area NDA. Though not shown, a second power supply line may be arranged outside the driving circuits, that is, the first scan driving circuit 11, the second scan driving circuit 12, and the emission control driving circuit 13.

The first scan driving circuit 11 may be configured to provide a scan signal to the pixel circuit PC through a scan line SL. The second scan driving circuit 12 may be arranged in parallel with the first scan driving circuit 11 with the display area DA disposed therebetween. Some of the pixel circuits PC arranged in the display area DA may be electrically connected to the first scan driving circuit 11, and the rest may be connected to the second scan driving circuit 12. In an embodiment, the second scan driving circuit 12 may be omitted.

The emission control driving circuit 13 may be arranged on the side of the first scan driving circuit 11 and configured to provide an emission control signal to the pixel circuit PC through an emission control line EL. Though it is shown in FIG. 3 that the emission control driving circuit 13 is arranged on only one side of the display area DA, the embodiment is not limited thereto. Like the first scan driving circuit 11 and the second scan driving circuit 12, the emission control driving circuit 13 may be arranged on two opposite sides of the display area DA.

The terminal 14 may be arranged in the peripheral area NDA of the substrate 100. The terminal 14 may be exposed and electrically connected to a printed circuit board PCB. A terminal PCB-P of the printed circuit board PCB may be electrically connected to the terminal 14 of the display panel 10.

The printed circuit board PCB may be configured to transfer a signal or power of a controller (not shown) to the display panel 10. A control signal generated from the controller may be transferred to the driving circuits, that is, the first scan driving circuit 11, the second scan driving circuit 12, and the emission control driving circuit 13 through the printed circuit board PCB. In addition, the controller may be configured to provide a driving voltage ELVDD (also referred to as a first power voltage) to the first power supply line 15 and provide a common voltage ELVSS (also referred to as a second power voltage) to the second power supply line. The driving voltage ELVDD may be provided to the pixel circuit PC through the power voltage line PL connected to the first power supply line 15. The common voltage ELVSS may be provided to an opposite electrode of a pixel connected to the second power supply line. The first power supply line 15 may extend in one direction (e.g. an x-direction) from below the peripheral area NDA. The second power supply line may surround at least a portion of the display panel 10 by having a loop shape having one open side.

In addition, the controller may generate a data signal, and the generated data signal may be transferred to an input line 17 through a data pad portion and transferred to the pixel circuit PC through a data line DL.

FIG. 4 is a plan view of a display apparatus according to an embodiment.

Referring to FIG. 4, a display apparatus 1' may include the first area DA1 and the second area DA2 as the display area DA, the first area DA1 being defined as a main display area, and the second area DA2 being defined as an auxiliary display area. The second area DA2 may be arranged to surround at least a portion of the first area DA1.

The display apparatus 1' shown in FIG. 4 is generally similar to the display apparatus of FIG. 1 but is different from the display apparatus of FIG. 1 in that the second area DA2 is arranged outside the first area DA1. Because other elements are the same as those of the previous embodiment, differences are mainly described below.

The second area DA2 of the display area DA of the display apparatus 1' may be disposed to correspond to at least a portion of the peripheral area NDA which is non-display area in the previous embodiment. The second pixels P2 may be arranged in the second area DA2. Accordingly, when the second area DA2 is disposed to correspond to at least a portion of the peripheral area NDA in the previous embodiment, it may mean that driving circuits may be arranged in the second area DA2, and a display element of the second pixel P2, for example, an organic light-emitting diode OLED is arranged in the second area DA2. That is, the driving circuits is arranged below the second pixel P2. The organic light-emitting diode OLED of the second pixel P2 may receive a signal and/or a voltage from a pixel circuit of the first pixel P1 arranged in an adjacent region, for example, the first area DA1.

Referring to FIG. 4, the display area DA of the display apparatus 1' may include first to fourth edges E1 to E4. In an embodiment, the first edge E1 may be symmetrically arranged to the third edge E3. The peripheral areas NDA may be respectively arranged outside the first edge E1 and the third edge E3.

The second edge E2 may be symmetrically arranged to the fourth edge E4. The second edge E2 and the fourth edge E4 may generally coincide with the edges of the display apparatus 1' when viewed from the front side. That is, the display apparatus 1' according to an embodiment may maximally extend in one direction (e.g. an x-direction) and implement a full-screen display when viewed from the front side.

Figure 5:
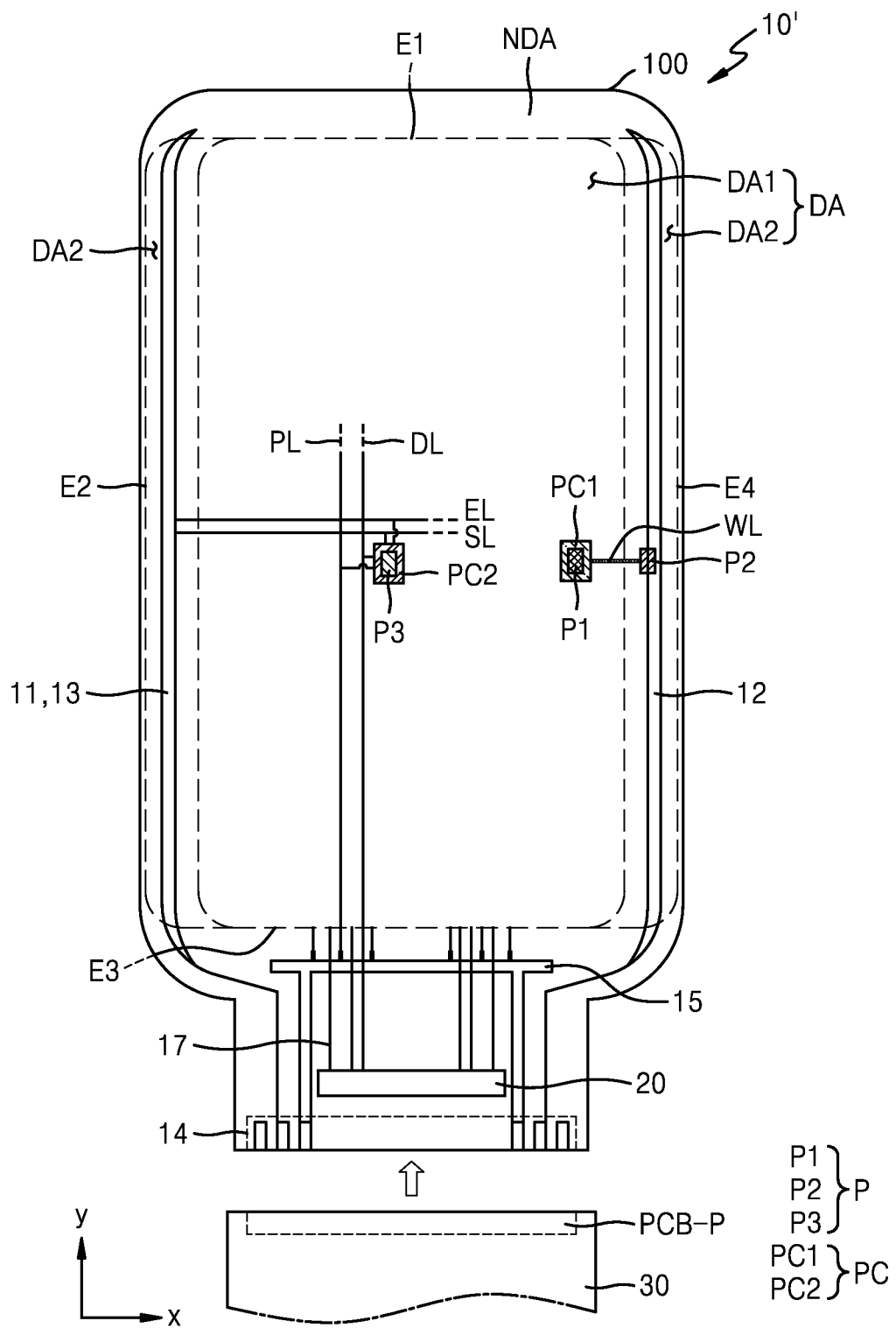
FIG. 5 is a plan view of a display panel of the display apparatus of FIG. 4.

FIG. 5 is a plan view of a display panel 10' of the display apparatus of FIG. 4. The display panel 10' shown in FIG. 5 is generally similar to the display panel 10 of FIG. 3 but is different from the display panel 10 in that the second area DA2 is arranged outside the first area DA1. Because other elements are the same as those of the previous embodiment, differences are mainly described below.

Referring to FIG. 5, the second pixel P2 arranged in the second area DA2 may overlap at least a portion of the driving circuits, that is, the first scan driving circuit 11, the second scan driving circuit 12, and the emission control driving circuit 13. The first pixel P1 arranged in the first area DA1 may include the first pixel circuit PC1 that overlaps at least a portion of the first pixel P1, and the third pixel P3 may include the second pixel circuit PC2 that overlaps at least a portion of the third pixel P3. However, the second pixel P2 arranged in the second area DA2 may overlap the driving circuits, that is, the first scan driving circuit 11, the second scan driving circuit 12, and the emission control driving circuit 13 disposed therebelow. That is, the pixel circuits, that is, the first pixel circuit PC1 and the second pixel circuit PC2 configured to drive the first pixel P1 and the third pixel P3 are provided below the first pixel P1 and third pixel P3, respectively, but the driving circuits, that is, the first scan driving circuit 11, the second scan driving circuit 12, and the emission control driving circuit 13 are arranged below the second pixel P2 to overlap the second pixel P2. A pixel circuit configured to drive the second pixel P2 may not be arranged below the second pixel P2.

Accordingly, the second pixel P2 may receive a signal and/or a voltage from the first pixel circuit PC1 of the first pixel P1 arranged in a region, for example, the first area DA1 adjacent to the second area DA2. As an example, the second pixel P2 arranged in the second area DA2 may be electrically connected to the first pixel circuit PC1 arranged in the first area DA1 through a connection wiring WL, and thus, the second pixel P2 may receive a signal and/or a voltage from the first pixel circuit PC1.

Figure 6:
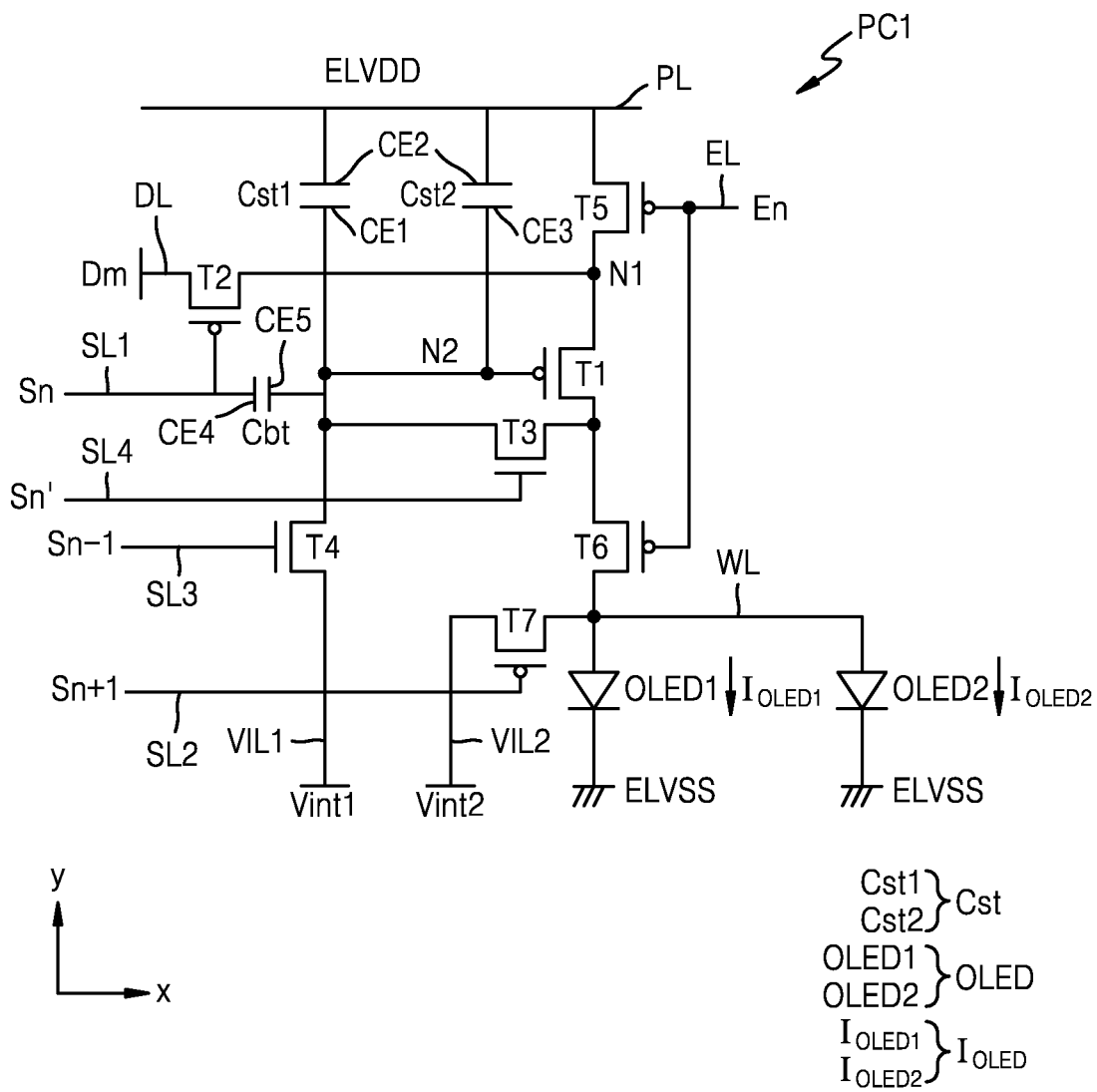
FIG. 6 is an equivalent circuit diagram of a pixel circuit applicable to a display apparatus according to an embodiment.

FIG. 6 is an equivalent circuit diagram of a pixel circuit applicable to a display apparatus according to an embodiment.

Referring to FIG. 6, the pixel circuit PC1 may be connected to signal lines and an organic light-emitting diode OLED. In detail, the first pixel circuit PC1 may be connected to signal lines, a first organic light-emitting diode OLED1 disposed in the first area DA1, and a second organic light-emitting diode OLED2 disposed in the second area DA2.

Referring to FIG. 6, the first pixel circuit PC1 may include first to seventh transistors T1, T2, T3, T4, T5, T6, and T7, and first to third storage capacitors Cst1, Cst2, and Cbt. The first to seventh transistors T1, T2, T3, T4, T5, T6, and T7, and the first to third storage capacitors Cst1, Cst2, and Cbt may be connected to signal lines, a first initialization voltage line VIL1, a second initialization voltage line VIL2, and a power voltage line PL. The signal lines may include a data line DL, a first scan line SL1, a second scan line SL2, a third scan line SL3, a fourth scan line SL4, and an emission control line EL. In an embodiment, at least one of the signal lines, the first and second initialization voltage lines VIL1 and VIL2, and/or the power voltage line PL may be shared by pixels adjacent to each other.

The power voltage line PL may be configured to transfer the first power voltage ELVDD to the first transistor T1. The first initialization voltage line VIL1 may be configured to transfer a first initialization voltage Vint1 to the first pixel circuit PC1, the first initialization voltage Vint1 initializing the first transistor T1. The second initialization voltage line VIL2 may be configured to transfer the second initialization voltage Vint2 to the first pixel circuit PC1, the second initialization voltage Vint2 initializing the organic light-emitting diode OLED.

The first scan line SL1, the second scan line SL2, the third scan line SL3, the fourth scan line SL4, the emission control line EL, the first initialization voltage line VIL1, and second initialization voltage line VIL2 may extend in the first direction (the x-direction) and be spaced apart from each other in each row. The data line DL and the power voltage line PL may extend in the second direction (a y-direction) and be spaced apart from each other in each column. However, the embodiment is not limited thereto.

It is shown in FIG. 6 that the third transistor T3 and the fourth transistor T4 among the first to seventh transistors T1, T2, T3, T4, T5, T6, and T7 are implemented as n-channel metal oxide semiconductor (NMOS) field effect transistors (FET), and the rest are implemented as p-channel metal oxide semiconductor (PMOS) field effect transistors (FET).

The first transistor T1 may be connected to the power voltage line PL through the fifth transistor T5 and electrically connected to the organic light-emitting diode OLED through the sixth transistor T6. The first transistor T1 may serve as a driving transistor, receive a data signal Dm in response to a switching operation of the second transistor T2, and supply a driving current $I_{OLED}$ to the organic light-emitting diode OLED.

The second transistor T2 may be connected to the first scan line SL1 and the data line DL and connected to the power voltage line PL through the fifth transistor T5. The second transistor T2 may be turned on in response to a first scan signal Sn transferred through the first scan line SL1 and may perform a switching operation to transfer a data signal Dm to a first node N1, the data signal Dm being transferred through the data line DL.

The third transistor T3 may be connected to the fourth scan line SL4 and connected to the organic light-emitting diode OLED through the sixth transistor T6. The third transistor T3 may be turned on in response to a fourth scan signal Sn' transferred through the fourth scan line SL4 to diode-connect the first transistor T1.

The fourth transistor T4 may be connected to the third scan line SL3, which is a previous scan line, and the first initialization voltage line VIL1, and turned on in response to a third scan signal Sn−1, which is a previous scan signal, transferred through the third scan line SL3 to initialize the voltage of a gate electrode of the first transistor T1 by transferring the first initialization voltage Vint1 to the gate electrode of the first transistor T1, the first initialization voltage Vint1 being supplied from the first initialization voltage line VIL1. However, the embodiment is not limited thereto.

The fifth transistor T5 and the sixth transistor T6 may be connected to the emission control line EL and simultaneously turned on in response to an emission control signal En transferred through the emission control line EL to form a current path such that the driving current $I_{OLED}$ flows in a direction from the power voltage line PL to the organic light-emitting diode OLED.

The seventh transistor T7 may be connected to the second scan line SL2, which is a next scan line, and the second initialization voltage line VIL2, turned on in response to a fourth scan signal Sn+1, which is a next scan signal, transferred through the second scan line SL2, and may initialize the organic light-emitting diode OLED by transferring a second initialization voltage Vint2 to the organic light-emitting diode OLED, the second initialization voltage Vint2 being supplied from the second initialization voltage line VIL2. However, the seventh transistor T7 may be omitted.

In an embodiment, the storage capacitor Cst may include a first storage capacitor Cst1 and a second storage capacitor Cst2 that are connected in parallel to each. In an embodiment, the first storage capacitor Cst1 may include a first electrode CE1 and a second electrode CE2. The second storage capacitor Cst2 may include the second electrode CE2 and a third electrode CE3. As an example, both the first storage capacitor Cst1 and the second storage capacitor Cst2 may include the second electrode CE2. That is, the second electrode CE2 may be included in common for the first storage capacitor Cst1 and the second storage capacitor Cst2.

In an embodiment, the first electrode CE1 may be connected to the gate electrode of the first transistor T1, and the second electrode CE2 may be connected to the power voltage line PL. The first storage capacitor Cst1 may maintain a voltage applied to the gate electrode of the first transistor T1 by storing and maintaining a voltage corresponding to a difference between voltages of two ends of the power voltage line PL and the gate electrode of the first transistor T1.

In an embodiment, the third electrode CE3 may be connected to the gate electrode of the first transistor T1, and the second electrode CE2 may be connected to the power voltage line PL. The second storage capacitor Cst2 may maintain a voltage applied to the gate electrode of the first transistor T1 by storing and maintaining a voltage corresponding to a difference between voltages of two ends of the power voltage line PL and the gate electrode of the first transistor T1. However, the embodiment is not limited thereto.

In an embodiment, because the storage capacitor includes the first storage capacitor Cst1 and the second storage capacitor Cst2 that are connected in parallel to each other, a capacitance (a total capacitance) of the storage capacitor Cst may be increased. Accordingly, as a capacitance value (a total capacitance value) of the storage capacitor Cst increases, the amount of driving current $I_{OLED}$ flowing through the organic light-emitting diode OLED may increase.

The third storage capacitor Cbt may include a fourth electrode CE4 and a fifth electrode CE5. The fourth electrode CE4 may be connected to the first scan line SL1 and a gate electrode of the second transistor T2. The fifth electrode CE5 may be connected to the gate electrode of the first transistor T1 and the first electrode CE1 of the first storage capacitor Cst1. The third storage capacitor Cbt is a boosting capacitor. When a first scan signal Sn of the first scan line SL1 is a voltage that turns off the second transistor T2, the third storage capacitor Cbt may reduce a voltage that displays black (a black voltage) by increasing a voltage of a node N2.

The organic light-emitting diode OLED may include a pixel electrode and an opposite electrode, and the opposite electrode may receive a second power voltage ELVSS. The organic light-emitting diode OLED may display an image by receiving the driving current $I_{OLED}$ from the first transistor T1 and emitting light.

Specific operations of the first pixel circuit PC1 and a pixel P electrically connected to the first pixel circuit PC1 according to an embodiment are described below During a first initialization period, when a third scan signal Sn−1, which is a previous scan signal, is supplied through the third scan line SL3, the fourth transistor T4 is turned on in response to the first scan signal Sn−1, and the first transistor T1 may be initialized by the first initialization voltage Vint1 supplied from the first initialization voltage line VIL1.

During a data programming period, when a first scan signal Sn and a fourth scan signal Sn' are respectively supplied through the first scan line SL1 and the fourth scan line SL4, the second transistor T2 and the third transistor T3 may be turned on in response to the first scan signal Sn and the fourth scan signal Sn'. In this case, the first transistor T1 may be diode-connected and forward-biased by the third transistor T3 that is turned on. Then, a voltage obtained by compensating for a threshold voltage Vth of the first transistor T1 from a data signal Dm supplied from the data line DL may be applied to the gate electrode of the first transistor T1. The first power voltage ELVDD and the compensation voltage may be respectively applied to two opposite ends of the storage capacitor Cst. A charge corresponding to a voltage difference between the two ends may be stored in the storage capacitor Cst. As an example, the first power voltage ELVDD and the compensation voltage may be respectively applied to two ends of the first storage capacitor Cst1 and the second storage capacitor Cst2, and a charge corresponding to a voltage difference between the two ends may be stored in the first storage capacitor Cst1 and the second storage capacitor Cst2.

During a light-emitting period, the fifth transistor T5 and the sixth transistor T6 may be turned on in response to an emission control signal En supplied from the emission control line EL. The driving current $I_{OLED}$ corresponding to a difference between a voltage of the gate electrode of the first transistor T1 and the first power voltage ELVDD may occur, and the driving current $I_{OLED}$ may be supplied to the organic light-emitting diode OLED through the sixth transistor T6.

During a second initialization period, when a second scan signal Sn+1 is supplied through the second scan line SL2, the seventh transistor T7 may be turned on in response to the second scan signal Sn+1, and the organic light-emitting diode OLED may be initialized by the second initialization voltage Vint2 supplied from the second initialization voltage line VIL2.

In an embodiment, at least one of the plurality of transistors, that is, the first to seventh transistors T1, T2, T3, T4, T5, T6, and T7 may include a semiconductor layer including an oxide, and the rest may include a semiconductor layer including silicon. In an embodiment, the first transistor that directly influences the brightness of the display apparatuses 1 and 1' may include polycrystalline silicon having high reliability, and thus, the display apparatuses 1 and F of high resolution may be implemented through this configuration.

Because an oxide semiconductor has a high carrier mobility and a low leakage current, a voltage drop is not large even though a driving time is long. That is, because color change of an image is not large depending on a voltage drop even though the display apparatus is driven at low frequencies, the display apparatus may be driven at low frequencies. As described above, because an oxide semiconductor has an advantage of a small leakage current, an oxide semiconductor may be employed as at least one of the third transistor T3 and the fourth transistor T4 each connected to the gate electrode of the first transistor T1, and thus, a leakage current that may flow to the gate electrode of the first transistor T1 may be prevented, and simultaneously, power consumption may be reduced.

As described above, because the second pixel P2 arranged in the second area DA2 does not include a pixel circuit PC therebelow, the second pixel P2 may be driven through the first pixel circuit PC1 arranged below the first pixel P1 in the first area DA1. In an embodiment, because the first pixel circuit PC1 is electrically connected to the second organic light-emitting diode OLED2 of the second pixel P2 through a connection wiring WL, the second pixel P2 may be driven through the first pixel circuit PC1.

Figure 7:
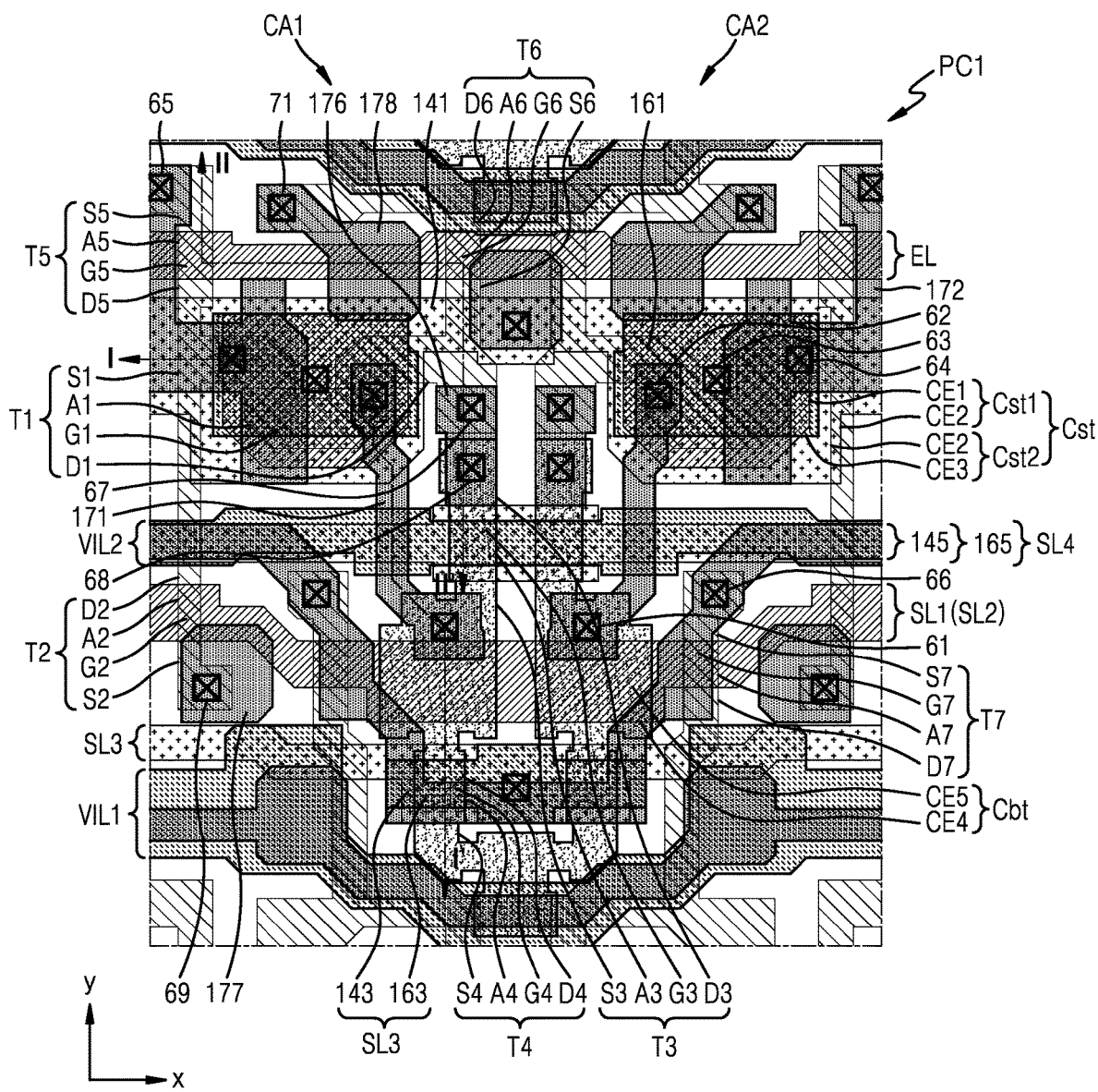
FIG. 7 is a layout diagram showing the positions of a plurality of transistors and storage capacitors arranged in a pair of pixel circuits of a display apparatus according to an embodiment.
Figure 8:
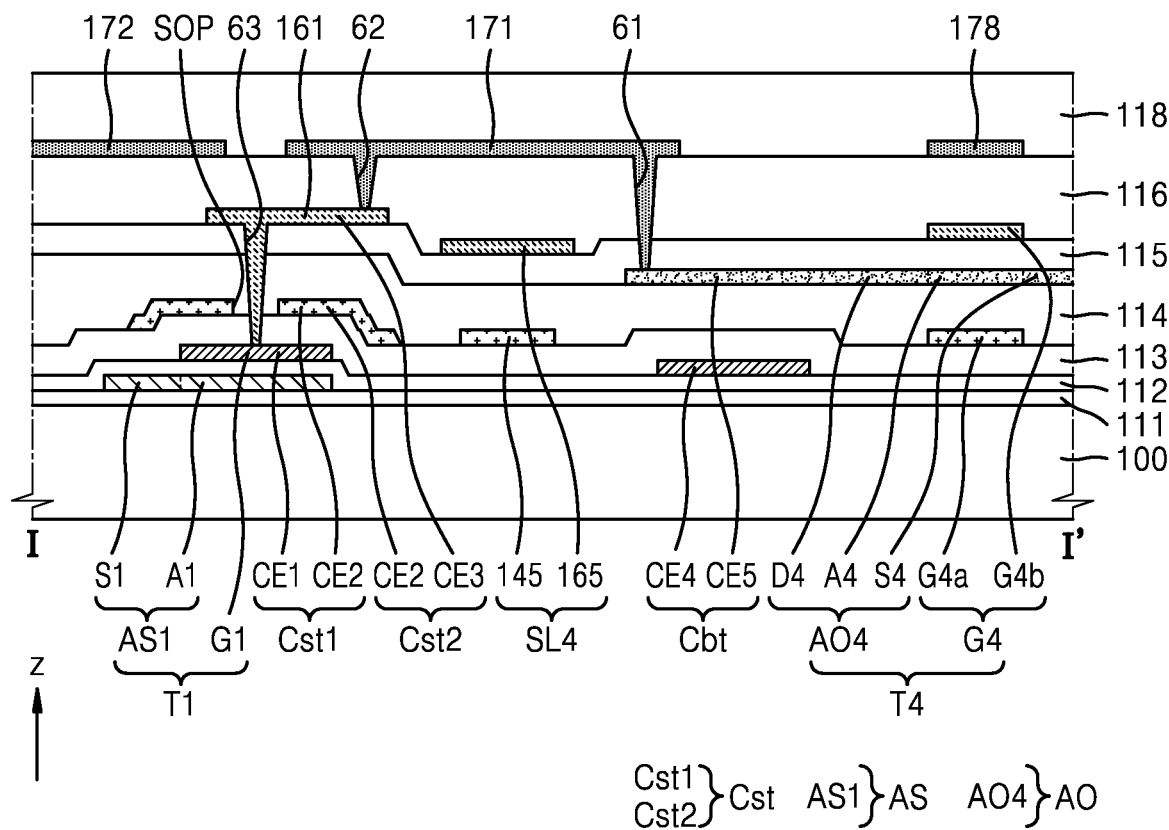
FIG. 8 is a cross-sectional view of the pixel circuit, taken along a line I-I' of FIG. 7.
Figure 9:
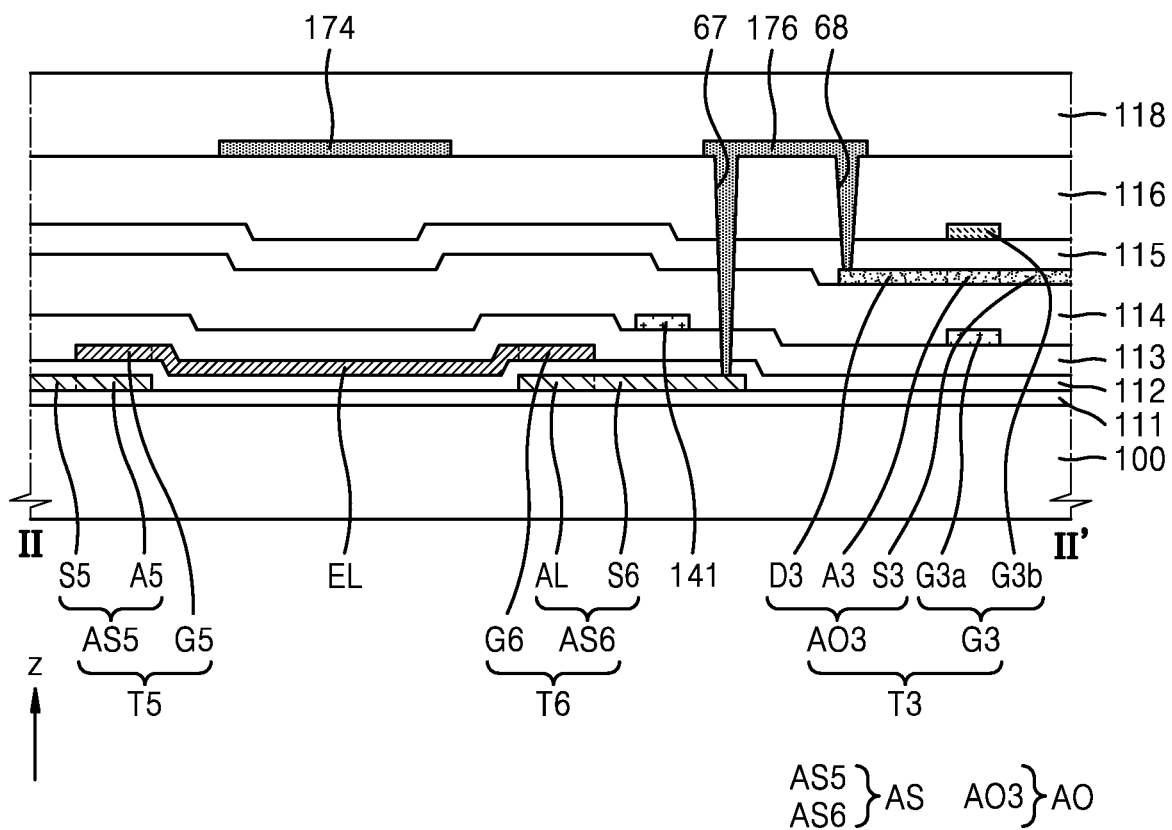
FIG. 9 is a cross-sectional view of the pixel circuit, taken along a line II-II' of FIG. 7.

FIG. 7 is a layout diagram showing the positions of a plurality of transistors and storage capacitors arranged in a pair of pixel circuits of a display apparatus according to an embodiment, FIG. 8 is a cross-sectional view of the pixel circuit, taken along line I-I' of FIG. 7, and FIG. 9 is a cross-sectional view of the pixel circuit, taken along line II-II' of FIG. 7.

FIG. 7 is a layout diagram of the first pixel circuit PC1 in which a pixel circuit arranged in a left pixel area CA1 shown in FIG. 7 and a pixel circuit arranged in a right pixel area CA2 shown in FIG. 7 are symmetrical to each other.

Referring to FIG. 7, the first pixel circuit PC1 of the display apparatus 1 according to an embodiment may include the first scan line SL1, the second scan line SL2, the third scan line SL3, the fourth scan line SL4, the emission control line EL, and the initialization voltage line each extending in the first direction (the x-direction).

In addition, the first pixel circuit PC1 may include the first transistor T1, the second transistor T2, the third transistor T3, the fourth transistor T4, the fifth transistor T5, the sixth transistor T6, the seventh transistor T7, the first storage capacitor Cst1, the second storage capacitor Cst2, and the third storage capacitor Cbt.

In an embodiment, the first transistor T1, the second transistor T2, the fifth transistor T5, the sixth transistor T6, and the seventh transistor T7 each may include a thin-film transistor including a silicon semiconductor. The third transistor T3 and the fourth transistor T4 may include a thin-film transistor including an oxide semiconductor.

The second scan line SL2 may be the first scan line SL1 connected to a pixel circuit disposed in the next row. That is, the first scan line SL1 shown in FIG. 7 may be the second scan line SL2 on a previous row.

The semiconductor layers of the first transistor T1, the second transistor T2, the fifth transistor T5, the sixth transistor T6, and the seventh transistor T7 may be arranged on the same layer and may include the same material. As an example, the semiconductor layer may include polycrystalline silicon as an active layer. The semiconductor layers of the first transistor T1, the second transistor T2, the fifth transistor T5, the sixth transistor T6, and the seventh transistor T7 may be connected and bent in various shapes.

The semiconductor layers of the first transistor T1, the second transistor T2, the fifth transistor T5, the sixth transistor T6, and the seventh transistor T7 each may include a channel region, a source region, and a drain region respectively arranged on two opposite sides of the channel region. In an embodiment, a source region and a drain region may be doped with impurities. The impurities may include N-type impurities or P-type impurities depending on types of the transistors. A source region and a drain region may respectively correspond to a source electrode and a drain electrode. A source region and a drain region may be exchanged with each other depending on an operation of a transistor. Hereinafter, terms of a source region and a drain region are used instead of a source electrode and a drain electrode.

The first transistor T1 may include a first semiconductor layer and a first gate electrode G1. The first semiconductor layer may include a first channel region A1, a first source region S1, and a first drain region D1, the first source region S1 and the first drain region D1 being respectively disposed on two opposite sides of the first channel region A1. Because the first semiconductor layer has a bent shape, the first channel region A1 may be formed longer than the other channel regions A2, A3, A4, A5, A6, and A7. As an example, because the first semiconductor layer has a shape bent multiple times to have shapes of 'ᄃ', 'ᄅ', 'S', 'M', and 'W', a long channel length may be formed in a narrow space. Because the first channel region A1 is formed long, a driving range of the gate voltage applied to the first gate electrode G1 is widened, and thus, a grayscale of light emitted from an organic light-emitting diode OLED may be more elaborately controlled and display quality may be improved. In an embodiment, the first semiconductor layer may have a straight line shape instead of a bent shape. The first gate electrode G1 may be an island type electrode and may overlap the first channel region A1 with a first gate insulating layer 112 (see FIG. 8) therebetween.

In an embodiment, the storage capacitor Cst may include the first storage capacitor Cst1 and the second storage capacitor Cst2. In this case, the first storage capacitor Cst1 and the second storage capacitor Cst2 may be connected in parallel to each other.

The first storage capacitor Cst1 may overlap the first transistor T1 in a plan view. The first storage capacitor Cst1 may include the first electrode CE1 and the second electrode CE2. The first gate electrode G1 may serve as the first electrode CE1 of the first storage capacitor Cst1 as well as a control electrode of the first transistor T1. That is, the first gate electrode G1 and the first electrode CE1 may be formed as one body. The second electrode CE2 of the first storage capacitor Cst1 may overlap the first electrode CE1 with a second gate insulating layer 113 (see FIG. 8) disposed therebetween. In this case, the second gate insulating layer 113 may serve as a dielectric layer of the first storage capacitor Cst1.

The second storage capacitor Cst2 may overlap the first transistor T1 in a plan view. The second storage capacitor Cst2 may include the second electrode CE2 and the third electrode CE3. The third electrode CE3 of the second storage capacitor Cst2 may overlap the second electrode CE2 with a first interlayer insulating layer 114 (see FIG. 8) and a third gate insulating layer 115 (see FIG. 8) disposed therebetween. In this case, the first interlayer insulating layer 114 and the third gate insulating layer 115 may serve as a dielectric layer of the second storage capacitor Cst2.

A node connection line 171 may electrically connect the first electrode CE1 and a third semiconductor layer of the third transistor T3. Specifically, one end of the node connection line 171 may be electrically connected to the third semiconductor layer of the third transistor T3 through a contact hole 61 (see FIG. 8), and another end of the node connection line 171 may be electrically connected to a connection electrode 161 through a contact hole 62 (see FIG. 8). In addition, the connection electrode 161 may be electrically connected to the first electrode CE1 through a contact hole 63 (see FIG. 8). Accordingly, the first electrode CE1 may be electrically connected to the third semiconductor layer of the third transistor T3. In this case, the connection electrode 161 may be provided as one body with the third electrode CE3 of the second storage capacitor Cst2.

The second electrode CE2 may be electrically connected to a first power voltage line 172. Accordingly, a voltage corresponding to the first power voltage ELVDD may be applied to the second electrode CE2.

The second transistor T2 may include a second semiconductor layer and a second gate electrode G2. The second semiconductor layer may include a second channel region A2, a second source region S2, and a second drain region D2, the second source region S2 and the second drain region D2 being respectively disposed on two opposite sides of the second channel region A2. The second source region S2 may be electrically connected to a data line (see FIG. 6), and the second drain region D2 may be electrically connected to the first node to which the first source region S1 is connected. The second gate electrode G2 may be provided as a portion of the first scan line SL1.

The fifth transistor T5 may include a fifth semiconductor layer and a fifth gate electrode G5. The fifth semiconductor layer may include a fifth channel region A5, a fifth source region S5, and a fifth drain region D5, the fifth source region S5 and the fifth drain region D5 being respectively disposed on two opposite sides of the fifth channel region A5. The fifth source region S5 may be electrically connected to the first power voltage line 175, and the fifth drain region D5 may be connected to the first source region S1. A fifth gate electrode G5 may be provided as a portion of the emission control line 135.

The sixth transistor T6 may include a sixth semiconductor layer and a sixth gate electrode G6. The sixth semiconductor layer may include a sixth channel region A6, a sixth source region S6, and a sixth drain region D6, the sixth source region S6 and the sixth drain region D6 being respectively disposed on two opposite sides of the sixth channel region A6. The sixth source region S6 may be connected to the first drain region D1, and the sixth drain region D6 may be electrically connected to a pixel electrode (not shown) of an organic light-emitting diode OLED. The sixth gate electrode G6 is provided as a portion of the emission control line EL.

The seventh transistor T7 may include a seventh semiconductor layer and a seventh gate electrode G7. The seventh semiconductor layer may include a seventh channel region A7, a seventh source region S7, and a seventh drain region D7, the seventh source region S7 and the seventh drain region D7 being respectively disposed on two opposite sides of the seventh channel region A7. The seventh source region S7 may be electrically connected to the second initialization voltage line VIL2, and the seventh drain region D7 may be connected to the sixth drain region D6. The seventh gate electrode G7 may be provided as a portion of the second scan line SL2.

The first interlayer insulating layer 114 (see FIG. 8) is arranged on the first, second, fifth to seventh transistors T1, T2, T5, T6, and T7 each including a silicon semiconductor. The third and fourth transistors T3 and T4 including an oxide semiconductor may be arranged on the first interlayer insulating layer 114.

The semiconductor layer of the third transistor T3 and the fourth transistor T4 may be arranged in the same layer and may include the same material. As an example, the semiconductor layer may include an oxide semiconductor.

The semiconductor layer may include a channel region, a source region, and a drain region, the source region and the drain region being respectively disposed on two opposite sides of the channel region. In an embodiment, the source region and the drain region may be regions in which carrier concentration has been increased by plasma treatment. The source region and the drain region may respectively correspond to a source electrode and a drain electrode. Hereinafter, terms of a source region and a drain region are used instead of a source electrode and a drain electrode.

The third transistor T3 may include a third semiconductor layer and a third gate electrode G3, the third semiconductor layer including an oxide semiconductor. The third semiconductor layer may include a third channel region A3, a third source region S3, and a third drain region D3, the third source region S3 and the third drain region D3 being respectively disposed on two opposite sides of the third channel region A3. The third source region S3 may be bridge-connected to the first gate electrode G1 through the node connection line 171. Specifically, one end of the node connection line 171 may be electrically connected to the third semiconductor layer of the third transistor T3 through the contact hole 61, and another end of the node connection line 171 may be electrically connected to the third electrode CE3 through the contact hole 62. In addition, the third electrode CE3 may be electrically connected to the first gate electrode G1 through the contact hole 63. Accordingly, the third semiconductor layer of the third transistor T3 may be electrically connected to the first gate electrode G1.

In addition, the third source region S3 may be connected to the fourth drain region D4 arranged on the same layer. The third drain region D3 may be electrically connected to the first semiconductor layer of the first transistor T1 and the sixth semiconductor layer of the sixth transistor T6. The third gate electrode G3 may be provided as a portion of the fourth scan line SL4.

The fourth transistor T4 may include a fourth semiconductor layer and a fourth gate electrode G4, the fourth semiconductor layer including an oxide semiconductor. The fourth semiconductor layer may include a fourth channel region A4, a fourth source region S4, and a fourth drain region D4, the fourth source region S4 and the fourth drain region D4 being respectively disposed on two opposite sides of the fourth channel region A4. The fourth source region S4 may be electrically connected to the first initialization voltage line VIL1. The fourth source region S4 may be electrically connected to a first initialization voltage line provided separately.

The fourth drain region D4 may be bridge-connected to the first gate electrode G1 through the node connection line 171. Specifically, one end of the node connection line 171 may be electrically connected to the fourth semiconductor layer of the fourth transistor T4 through the contact hole 61, and another end of the node connection line 171 may be electrically connected to the connection electrode 161 through the contact hole 62. In addition, the connection electrode 161 may be electrically connected to the first gate electrode G1 through the contact hole 63. Accordingly, the fourth semiconductor layer of the fourth transistor T4 may be electrically connected to the first gate electrode G1. The fourth gate electrode G4 may be provided as a portion of the third scan line SL3.

A third gate insulating layer 115 (see FIGS. 8 and 9) may be arranged between the third semiconductor layer and the third gate electrode G3 and between the fourth semiconductor layer and the fourth gate electrode G4.

The fourth electrode CE4 of the third storage capacitor Cbt may be provided as a portion of the first scan line SL1 and connected to the second gate electrode G2. The fifth electrode CE5 of the third storage capacitor Cbt may overlap the fourth electrode CE4 and be provided as an oxide semiconductor. The fifth electrode CE5 may be arranged in the same layer as the third semiconductor layer of the third transistor T3 and the fourth semiconductor layer of the fourth transistor T4 and be a region disposed between the third semiconductor layer and the fourth semiconductor layer. Alternatively, the fifth electrode CE5 may extend from the fourth semiconductor layer. Alternatively, the fifth electrode CE5 may extend from the third semiconductor layer.

The second interlayer insulating layer 116 (see FIGS. 8 and 9) may be arranged on the third and fourth transistors T3 and T4 each including an oxide semiconductor. The first power voltage line 172 and the node connection line 171 may be arranged on the second interlayer insulating layer 116.

A first planarization layer 118 (see FIGS. 8 and 9) may be arranged on the first power voltage line 172. A data line and a second power voltage line (not shown) may be arranged on the first planarization layer 118.

In an embodiment, the first scan line SL1, the second scan line SL2, and the emission control line EL may be arranged in the same layer as the first gate electrode G1 and may include the same material as that of the first gate electrode G1.

In an embodiment, some of the wirings may be provided as two conductive layers arranged in different layers. As an example, the third scan line SL3 may include a lower scan line 143 and an upper scan line 163 arranged in different layers. The lower scan line 143 may be arranged in the same layer as the second electrode CE2 of the first storage capacitor Cst1 and may include the same material as that of the second electrode CE2. The upper scan line 163 may be arranged on the third gate insulating layer 115 (see FIG. 8). The lower scan line 143 may overlap at least a portion of the upper scan line 163. Because the lower scan line 143 and the upper scan line 163 correspond to a portion of the fourth gate electrode G4 of the fourth transistor T4, the fourth transistor T4 may have a dual gate structure in which control electrodes are respectively provided above and below the semiconductor layer.

In addition, the fourth scan line SL4 may include a lower scan line 145 and an upper scan line 165 arranged in different layers. The lower scan line 145 may be arranged in the same layer as the second electrode CE2 of the first storage capacitor Cst1 and may include the same material as that of the second electrode CE2. The upper scan line 165 may be arranged on the third gate insulating layer 115 (see FIG. 8). The lower scan line 145 may overlap at least a portion of the upper scan line 165. Because the lower scan line 145 and the upper scan line 165 correspond to a portion of the third gate electrode G3 of the third transistor T3, the third transistor T3 may have a dual gate structure in which control electrodes are respectively provided above and below the semiconductor layer.

The initialization voltage line VIL may include the first initialization voltage line VIL1 and the second initialization voltage line VIL2 arranged in different layers. The first initialization voltage line VIL1 may be arranged in the same layer as the third electrode CE3 of the second storage capacitor Cst2 and may include the same material as that of the third electrode CE3. However, the embodiment is not limited thereto. The first initialization voltage line VIL1 may be arranged in the same layer as the first electrode CE1 of the first storage capacitor Cst1 and may include the same material as that of the first electrode CE1, or be arranged in the same layer as the second electrode CE2 of the first storage capacitor Cst1 and may include the same material as that of the second electrode CE2. The second initialization voltage line VIL2 may be arranged in the same layer as the first power voltage line 172 and may include the same material as that of the first power voltage line 172.

FIGS. 8 and 9 show cross-sections of portions corresponding to the first transistor T1, the third transistor T3, the fourth transistor T4, the fifth transistor T5, the sixth transistor T6, the first storage capacitor Cst1, the second storage capacitor Cst2, and the third storage capacitor Cbt shown in FIG. 7, and some members may be omitted.

The substrate 100 may include glass, a ceramic material, a metal material, or a flexible or bendable material. In the case where the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate.

The substrate 100 may have a single-layered structure or a multi-layered structure including the above materials and may further include an inorganic layer in the case the substrate 100 has a multi-layered structure. As an example, the substrate 100 may include a first base layer (not shown), a first barrier layer (not shown), a second base layer (not shown), and a second barrier layer (not shown). The first base layer and the second base layer may each include a polymer resin. The first barrier layer and the second barrier layer are barrier layers configured to prevent the penetration of external foreign substance and may include a single layer or a multi-layer including an inorganic material such as silicon nitride ($SiN_x$) or silicon oxide ($SiO_x$).

A buffer layer 111 may be arranged on the substrate 100. The buffer layer 111 may increase flatness of the upper surface of the substrate 100 and include an oxide layer including silicon oxide ($SiO_x$), a nitride layer including silicon nitride ($SiN_x$), or silicon oxynitride (SiON).

The semiconductor layers of the first transistor T1, the second transistor T2, the fifth transistor T5, the sixth transistor T6, and the seventh transistor T7 may be arranged on the buffer layer 111.

A semiconductor layer AS may include the first channel region A1, the first source region S1, and the first drain region D1, which correspond to a first semiconductor layer AS1 of the first transistor T1, the second channel region A2, the second source region S2, and the second drain region D2, which correspond to a second semiconductor layer AS2 of the second transistor T2, the fifth channel region A5, the fifth source region S5, and the fifth drain region D5, which correspond to a fifth semiconductor layer AS5 of the fifth transistor T5, the sixth channel region A6, the sixth source region S6, and the sixth drain region D6, which correspond to a fifth semiconductor layer AS6 of the sixth transistor T6, and the seventh channel region A7, the seventh source region S7, and the seventh drain region D7, which correspond to a seventh semiconductor layer AS7 of the seventh transistor T7. That is, the channel region, the source region, and the drain region of each of the first to seventh transistors T1, T2, T3, T4, T5, T6, and T7 may be partial regions of the semiconductor layer AS.

The first gate insulating layer 112 may be arranged on the semiconductor layer AS. The first gate insulating layer 112 may include an inorganic material including an oxide or a nitride. As an example, the first gate insulating layer 112 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

The first gate electrode G1 of the first transistor T1, the second gate electrode G2 of the second transistor T2, the fifth gate electrode G5 of the fifth transistor T5, the sixth gate electrode G6 of the sixth transistor T6, and the seventh gate electrode G7 of the seventh transistor T7 may be arranged on the first gate insulating layer 112. The first scan line SL1 and the emission control line EL may be arranged on the first gate insulating layer 112. A portion of the first scan line SL1 may be the fourth electrode CE4 of the third storage capacitor Cbt.

The first gate electrode G1 of the first transistor T1 may be provided in an island type. The second gate electrode G2 of the second transistor T2 may be a portion of the first scan line SL1 crossing the semiconductor layer AS of the second gate electrode G2. The seventh gate electrode G7 of the seventh transistor T7 may be a portion of the first scan line SL1 crossing the semiconductor layer AS or a portion of the second scan line SL2 which is a first scan line on the next row. The fifth gate electrode G5 of the fifth transistor T5 and the sixth gate electrode G6 of the sixth transistor T6 may be portions of the emission control line EL crossing the semiconductor layer AS.

The first gate electrode G1 of the first transistor T1 may serve as the first electrode CE1 of the first storage capacitor Cst1 as well as a control electrode of the first transistor T1.

The gate electrodes of the first transistor T1, the second transistor T2, the fifth transistor T5, the sixth transistor T6, and the seventh transistor T7 may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and may include a single layer or a multi-layer including the above materials.

The second gate insulating layer 113 may be arranged on the gate electrodes. The second gate insulating layer 113 may include an inorganic material including an oxide or a nitride. As an example, the second gate insulating layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

The second electrode CE2 may be arranged on the second gate insulating layer 113 to overlap the first electrode CE1. The second electrode CE2 may include an opening SOP. The opening SOP is formed by removing a portion of the second electrode CE2 and may have a closed shape.

The second gate insulating layer 113 may serve as a dielectric layer of the first storage capacitor Cst1. The second electrodes CE2 of adjacent pixels may be connected by a bridge 141. The bridge 141 is a portion protruding in the first direction (the x-direction) from the second electrode CE2 and may be formed as one body with the second electrode CE2.

The second electrode CE2 of the first storage capacitor Cst1 may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and include a single layer or a multi-layer including the above materials.

The lower scan line 143 of the third scan line SL3 and the lower scan line 145 of the fourth scan line SL4 may be arranged on the second gate insulating layer 113, the lower scan lines 143 and 145 including the same material as that of the second electrode CE2 of the first storage capacitor Cst1. In an embodiment, the first initialization voltage line VIL1 may be arranged on the second gate insulating layer 113. However, the embodiment is not limited thereto.

A portion of the lower scan line 143 of the third scan line SL3 that overlaps a semiconductor layer AO may be a lower gate electrode G4a of the fourth transistor T4. A portion of the lower scan line 145 of the fourth scan line SL4 that overlaps the semiconductor layer AO may be a lower gate electrode G3a of the third transistor T3.

The first interlayer insulating layer 114 may be arranged on the second electrode CE2 of the first storage capacitor Cst1. The first interlayer insulating layer 114 may include an inorganic material including an oxide or a nitride. As an example, the first interlayer insulating layer 114 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

The semiconductor layer AO including an oxide semiconductor may be arranged on the first interlayer insulating layer 114. The semiconductor layer AO may include Zn-oxide-based material and include Zn-oxide, In—Zn oxide, and Ga—In—Zn oxide. In an embodiment, the semiconductor layer AO may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

Each of the semiconductor layers of the third transistor T3 and the fourth transistor T4 may include a channel region, a source region, and a drain region, the source region and the drain region being respectively disposed on two opposite sides of the channel region. The source region and the drain region of the third transistor T3 and the fourth transistor T4 may be formed by adjusting carrier concentration of an oxide semiconductor and making the source region and the drain region conductive. For example, the source region and the drain region of the third transistor T3 and the fourth transistor T4 may be formed by increasing carrier concentration through plasma treatment that uses a hydrogen (H)-based gas, a fluorine (F)-based gas, or a combination of these performed on the oxide semiconductor.

The semiconductor layer AO may include the third channel region A3, the third source region S3, and the third drain region D3, which correspond to a third semiconductor layer AO3 of the third transistor T3, the fourth channel region A4, the fourth source region S4, and the fourth drain region D4, which correspond to a fourth semiconductor layer AO4 of the fourth transistor T4. That is, the channel regions, the source regions, and the drain regions of the third transistor T3 and the fourth transistor T4 may be partial regions of the semiconductor layer AO. A fourth source region S4 of the fourth transistor T4 may overlap the first initialization voltage line VIL1. However, the embodiment is not limited thereto.

The semiconductor layer AO may include the fifth electrode CE5 of the third storage capacitor Cbt. The fifth electrode CE5 of the third storage capacitor Cbt may be arranged between the third semiconductor layer AO3 of the third transistor T3 and the fourth semiconductor layer AO4 of the fourth transistor T4. The fifth electrode CE5 may extend from the third semiconductor layer AO3 of the third transistor T3 or the fourth semiconductor layer AO4 of the fourth transistor T4. That is, the fifth electrode CE5 may include an oxide semiconductor and be arranged on the first interlayer insulating layer 114. The second gate insulating layer 113 and the first interlayer insulating layer 114 may be arranged between the fourth electrode CE4 and the fifth electrode CE5 of the third storage capacitor Cbt. The second gate insulating layer 113 and the first interlayer insulating layer 114 may serve as a dielectric layer of the third storage capacitor Cbt.

The upper scan line 163 of the third scan line SL3 and the upper scan line 165 of the fourth scan line SL4 may be arranged on the semiconductor layer AO. That is, the third scan line SL3 and the fourth scan line SL4 may be provided as two conductive layers arranged in different layers.

The upper scan line 163 of the third scan line SL3 may overlap at least a portion of the lower scan line 143. The upper scan line 165 of the fourth scan line SL4 may overlap at least a portion of the lower scan line 145. The third gate insulating layer 115 may be arranged between the semiconductor layer AO, and the upper scan line 163 of the third scan line SL3 and the upper scan line 165 of the fourth scan line SL4. Though not shown, the third gate insulating layer 115 may be patterned in a shape corresponding to the upper scan line 163 of the third scan line SL3 and the upper scan line 165 of the fourth scan line SL4.

A portion of the upper scan line 163 of the third scan line SL3 that overlaps the fourth semiconductor layer AO4 may be an upper gate electrode G4b of the fourth transistor T4. A portion of the upper scan line 165 of the fourth scan line SL4 that overlaps the third semiconductor layer AO3 may be an upper gate electrode G3b of the third transistor T3. That is, the third transistor T3 and the fourth transistor T4 may each have a dual gate structure in which control electrodes are respectively provided above and below the semiconductor layer.

The third gate insulating layer 115 may include an inorganic material including an oxide or a nitride. As an example, the third gate insulating layer 115 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The upper gate electrode G3b of the third transistor T3 and the upper gate electrode G4b of the fourth transistor T4 may be arranged on the third gate insulating layer 115, may include at least one of molybdenum (Mo), copper (Cu), and titanium (Ti), and include a single layer or a multi-layer.

The second interlayer insulating layer 116 may cover the third transistor T3 and the fourth transistor T4. The second interlayer insulating layer 116 may be arranged on the upper gate electrode G3b of the third transistor T3 and the upper gate electrode G4b of the fourth transistor T4. The first power voltage line 172, the second initialization voltage line VIL2, the node connection line 171, and the connection electrodes may be arranged on the second interlayer insulating layer 116.

The second interlayer insulating layer 116 may include an inorganic material including an oxide or a nitride. As an example, the second interlayer insulating layer 116 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

The first power voltage line 172, the second initialization voltage line VIL2, the node connection line 171, and the connection electrodes may include a material having a high conductivity such as metal and a conductive oxide. As an example, the first power voltage line 172, the second initialization voltage line VIL2, the node connection line 171, and the connection electrodes may include a single layer or a multi-layer including at least one of aluminum (Al), copper (Cu), titanium (Ti), etc. In an embodiment, the first power voltage line 172, the second initialization voltage line VIL2, the node connection line 171, and the connection electrodes may include a triple layer of Ti/Al/Ti in which titanium, aluminum, and titanium are sequentially arranged.

The first power voltage line 172 may be electrically connected to the second electrode CE2 of the first storage capacitor Cst1 through a contact hole 64 (see FIG. 7) defined in the first interlayer insulating layer 114, the third gate insulating layer 115, and the second interlayer insulating layer 116. The first power voltage line 172 may be connected to the fifth drain region D5 of the fifth transistor T5 through a contact hole 65 (see FIG. 7) defined in the first gate insulating layer 112, the second gate insulating layer 113, the first interlayer insulating layer 114, the third gate insulating layer 115, and the second interlayer insulating layer 116.

The second initialization voltage line VIL2 may be electrically connected to the seventh drain region D7 of the seventh transistor T7 through a contact hole 66 (see FIG. 7) defined in the first gate insulating layer 112, the second gate insulating layer 113, the first interlayer insulating layer 114, the third gate insulating layer 115, and the second interlayer insulating layer 116.

One end of the node connection line 171 may be electrically connected to the fourth drain region D4 of the fourth transistor T4, the third source region S3 of the third transistor T3, or the fifth electrode CE5 of the third storage capacitor Cbt through the contact hole 61. The contact hole 61 may be defined in the third gate insulating layer 115 and the second interlayer insulating layer 116. Another end of the node connection line 171 may be electrically connected to the third electrode CE3 through the contact hole 62. The contact hole 62 may be defined in the second interlayer insulating layer 116. In addition, the third electrode CE3 may be electrically connected to the first gate electrode G1 through the contact hole 63. The contact hole 63 may be defined in the second gate insulating layer 113, the first interlayer insulating layer 114, and the third gate insulating layer 115. Accordingly, the fifth electrode CE5 of the third storage capacitor Cbt may be electrically connected to the first gate electrode G1. Accordingly, when a first scan signal Sn having a turn-off level is supplied to the first scan line, the third storage capacitor Cbt may raise the voltage of the node N2 (see FIG. 6) to securely turn-off the first transistor T1 to clearly express a black grayscale.

One end of the connection electrode 176 may be connected to the first drain region D1 of the first transistor T1 and the sixth source region S6 of the sixth transistor T6 through a contact hole 67. The contact hole 67 may pass through the first gate insulating layer 112, the second gate insulating layer 113, the first interlayer insulating layer 114, the third gate insulating layer 115, and the second interlayer insulating layer 116 to expose the silicon semiconductor layer. Another end of the connection electrode 176 may be connected to the third drain region D3 of the third transistor T3 through a contact hole 68. The contact hole 68 may pass through the third gate insulating layer 115 and the second interlayer insulating layer 116 to expose the oxide semiconductor layer.

A connection electrode 177 may be connected to the second source region S2 of the second transistor T2 through a contact hole 69 defined in the first gate insulating layer 112, the second gate insulating layer 113, the first interlayer insulating layer 114, the third gate insulating layer 115, and the second interlayer insulating layer 116.

A connection electrode 178 may be connected to the sixth drain region D6 of the sixth transistor T6 through a contact hole 71 defined in the first gate insulating layer 112, the second gate insulating layer 113, the first interlayer insulating layer 114, the third gate insulating layer 115, and the second interlayer insulating layer 116.

Though not shown, the data line DL, the second power voltage line, and the connection electrodes may be arranged on the first planarization layer 118.

The data line DL may be connected to the second source region S2 of the second transistor T2 by being connected to the connection electrode 177 through a contact hole defined in the first planarization layer 118. In an embodiment, the data line DL may overlap a portion of the first power voltage line 172. In a cross-sectional view, the first power voltage line 172 may be arranged between the first gate electrode G1 of the first transistor T1 and the data line DL. A portion of the first power voltage line 172 may be arranged between the data line DL and the node connection line 171 in a plan view. Accordingly, the first power voltage line 172 may reduce coupling between the node connection line 171 and the first gate electrode G1 and between the node connection line 171 and the data line DL. However, the embodiment is not limited thereto.

The second power voltage line (not shown) may be connected to the first power voltage line 172 through a contact hole defined in the first planarization layer 118. The second power voltage line may cover the third semiconductor layer AO3 of the third transistor T3 and the fourth semiconductor layer AO4 of the fourth transistor T4. The second power voltage line may block light that may be incident from above the substrate 100. In addition, a portion of the second power voltage line may overlap the node connection line 171. Another portion of the second power voltage line may be arranged between the data line DL and the node connection line 171. Accordingly, the second power voltage line may reduce coupling between the node connection line 171 and the data line DL. However, the embodiment is not limited thereto.

The connection electrode (not shown) may be connected to the sixth drain region D6 of the sixth transistor T6 by being connected to the connection electrode 178 through a contact hole defined in the first planarization layer 118. Because the connection electrode is connected to a pixel electrode (not shown) through a contact hole defined in the second planarization layer 119 (see FIG. 13) on the first planarization layer 118, the connection electrode may be configured to transfer a signal applied through the sixth transistor T6 to the pixel electrode.

The first planarization layer 118 and the second planarization layer 119 may include an organic material such as benzocyclobutene (BCB), polyimide, and hexamethyldisiloxane (HMDSO). Alternatively, the first planarization layer 118 and the second planarization layer 119 may include an inorganic material. The first planarization layer 118 and the second planarization layer 119 may serve as protection layers covering the first to seventh transistors T1, T2, T3, T4, T5, T6, and T7. The upper portions of the first planarization layer 118 and the second planarization layer 119 may be flat. The first planarization layer 118 and the second planarization layer 119 may include a single layer or a multi-layer.

Figure 10:
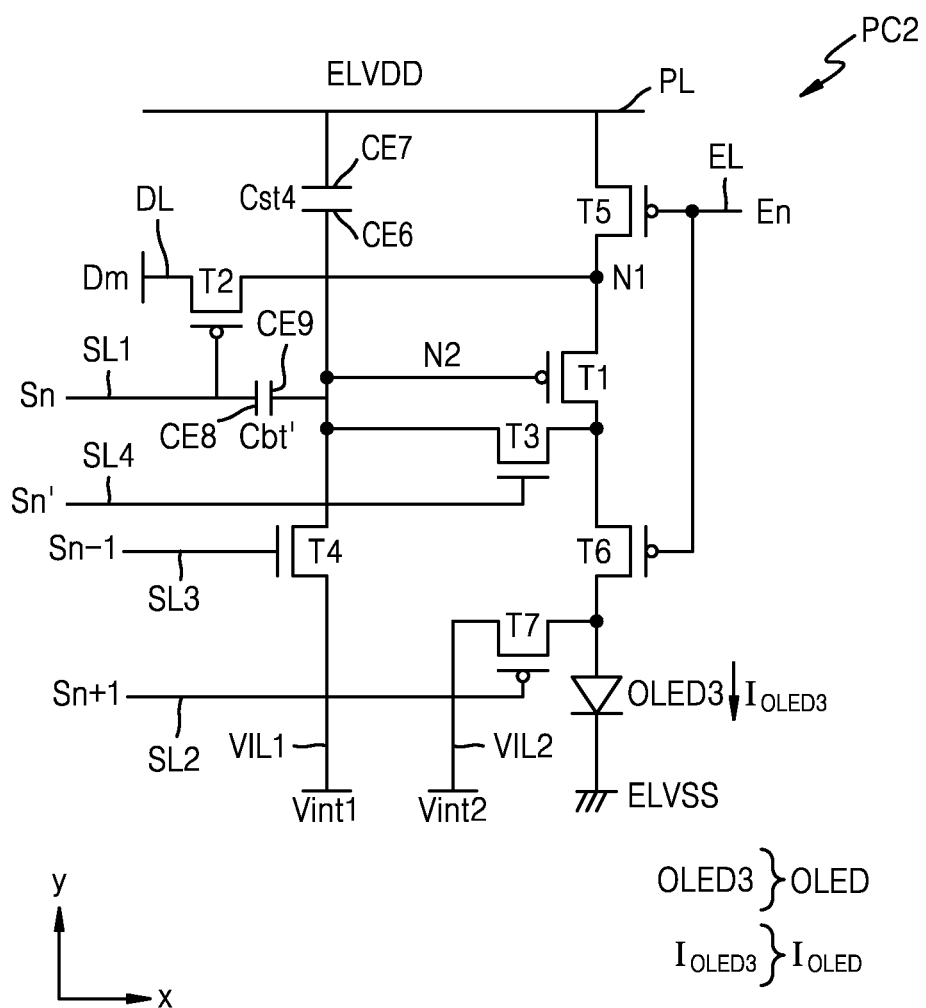
FIG. 10 is an equivalent circuit diagram of a pixel circuit applicable to a display apparatus according to an embodiment.

FIG. 10 is an equivalent circuit diagram of a pixel circuit applicable to a display apparatus according to an embodiment. The embodiment of FIG. 10 is different from the embodiment of FIG. 6 in that the second electrode CE2 and the third electrode CE3 do not constitute the second storage capacitor Cst2. Because the other elements are the same as those of the previous embodiment, differences are mainly described below.

Referring to FIG. 10, the second pixel circuit PC2 may include the first to seventh transistors T1, T2, T3, T4, T5, T6, and T7, a fourth storage capacitor Cst4, and a fifth storage capacitor Cbt'. The first to seventh transistors T1, T2, T3, T4, T5, T6, and T7, the fourth storage capacitor Cst4, and the fifth storage capacitor Cbt' may be connected to signal lines, the first initialization voltage line VIL1, the second initialization voltage line VIL2, and the power voltage line PL. The signal lines may include the data line DL, the first scan line SL1, the second scan line SL2, the third scan line SL3, the fourth scan line SL4, and the emission control line EL. In an embodiment, at least one of the signal lines, the first and second initialization voltage lines VIL1 and VIL2, and/or the power voltage line PL may be shared by pixels that are disposed adjacent to each other.

In an embodiment, the fourth storage capacitor Cst4 may include a sixth electrode CE6 and a seventh electrode CE7. In an embodiment, the sixth electrode CE6 may be connected to the gate electrode of the first transistor T1, and the seventh electrode CE7 may be connected to the power voltage line PL. The fourth storage capacitor Cst4 may maintain a voltage applied to the gate electrode of the first transistor T1 by storing and maintaining a voltage corresponding to a difference between voltages applied to two ends of the power voltage line PL and the gate electrode of the first transistor T1.

The fifth storage capacitor Cbt' may include an eighth electrode CE8 and a ninth electrode CE9. The eighth electrode CE8 may be connected to the first scan line SL1 and the gate electrode of the second transistor T2. The ninth electrode CE9 may be connected to the gate electrode of the first transistor T1 and the sixth electrode CE6 of the fourth storage capacitor Cst4. The fifth storage capacitor Cbt' is a boosting capacitor. When a first scan signal Sn of the first scan line SL1 is a voltage that turns off the second transistor T2, The fifth storage capacitor Cbt' raises the voltage of the node N2 to securely turn-off the first transistor T1 to clearly express a black grayscale.

Figure 11:
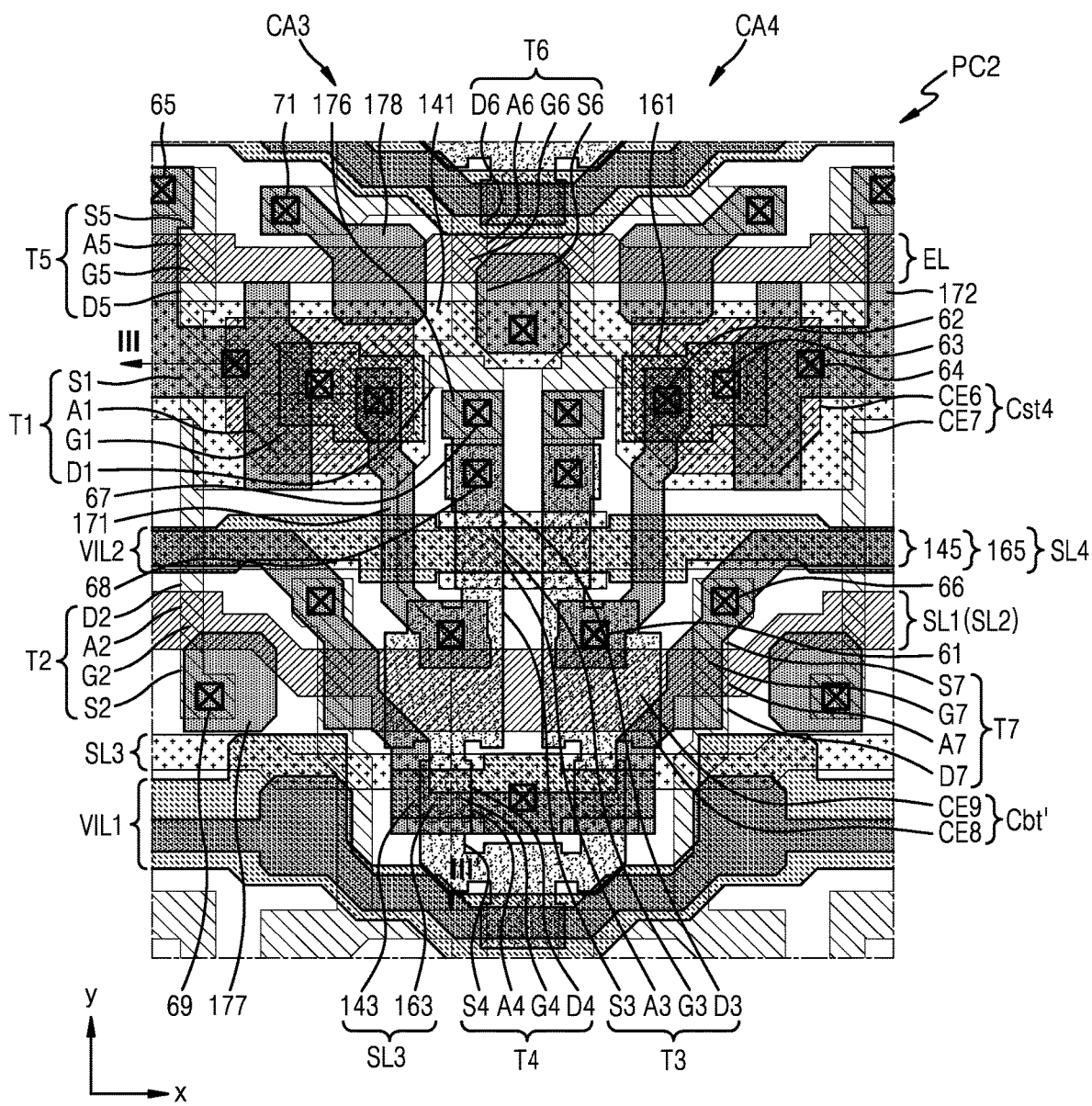
FIG. 11 is a layout diagram showing the positions of a plurality of transistors and storage capacitors arranged in a pair of pixel circuits of a display apparatus according to an embodiment.
Figure 12:
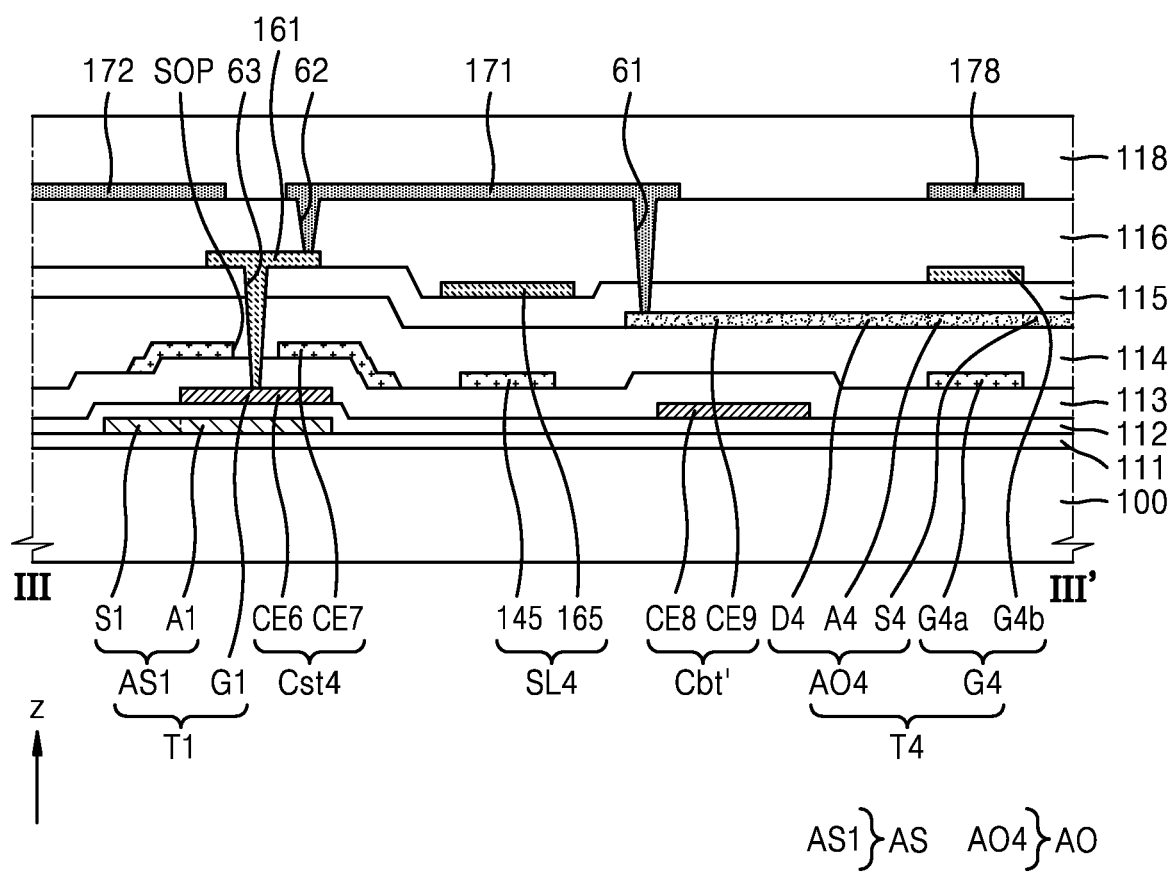
FIG. 12 is a cross-sectional view of the pixel circuit, taken along a line III-III' of FIG. 11.

FIG. 11 is a layout diagram showing the positions of a plurality of transistors and storage capacitors arranged in a pair of pixel circuits of a display apparatus according to an embodiment, and FIG. 12 is a cross-sectional view of the pixel circuit, taken along line III-III' of FIG. 11.

The embodiment of FIGS. 11 and 12 is different from the embodiment of FIGS. 7 and 8 in that the second electrode CE2 and the third electrode CE3 do not constitute the second storage capacitor Cst2. Because the other elements are the same as those of the previous embodiment, differences are mainly described below. In addition, in FIGS. 11 and 12, the sixth electrode CE6, the seventh electrode CE7, the eighth electrode CE8, and the ninth electrode CE9 may be respectively the first electrode CE1, the second electrode CE2, the fourth electrode CE4, and the fifth electrode CE5 of FIGS. 7 and 8.

FIG. 11 is a layout diagram of the second pixel circuit PC2. A pixel circuit arranged in the left pixel area CA3 and a pixel circuit arranged in the right pixel area CA4 shown in FIG. 11 are symmetrical to each other.

Referring to FIG. 11, the second pixel circuit PC2 of the display apparatus 1 according to an embodiment may include the first scan line SL1, the second scan line SL2, the third scan line SL3, the fourth scan line SL4, the emission control line EL, and the initialization voltage line VIL1 each extending in the first direction (the x-direction).

In addition, the second pixel circuit PC2 may include the first transistor T1, the second transistor T2, the third transistor T3, the fourth transistor T4, the fifth transistor T5, the sixth transistor T6, the seventh transistor T7, the fourth storage capacitor Cst4, and the fifth storage capacitor Cbt'.

The fourth storage capacitor Cst4 may overlap the first transistor T1. The fourth storage capacitor Cst4 may include the sixth electrode CE6 and the seventh electrode CE7. The first gate electrode G1 may serve as the sixth electrode CE6 of the fourth storage capacitor Cst4 as well as the control electrode of the first transistor T1. That is, the first gate electrode G1 and the sixth electrode CE6 may be formed as one body. The seventh electrode CE7 of the fourth storage capacitor Cst4 may overlap the sixth electrode CE6 with the second gate insulating layer 113 (see FIG. 12) interposed therebetween. In this case, the second gate insulating layer 113 may serve as a dielectric of the fourth storage capacitor Cst4.

The node connection line 171 may be electrically connected to the sixth electrode CE6 and the third semiconductor layer of the third transistor T3. Specifically, one end of the node connection line 171 may be electrically connected to the third semiconductor layer of the third transistor T3 through the contact hole 61 (see FIG. 12), and another end of the node connection line 171 may be electrically connected to the connection electrode 161 through a contact hole 62 (see FIG. 12). In addition, the connection electrode 161 may be electrically connected to the sixth electrode CE6 through the contact hole 63 (see FIG. 12). Accordingly, the sixth electrode CE6 may be electrically connected to the third semiconductor layer of the third transistor T3.

The seventh electrode CE7 may be electrically connected to the first power voltage line 172. Accordingly, a voltage corresponding to the first power voltage ELVDD may be applied to the seventh electrode CE7.

The eighth electrode CE8 of the fifth storage capacitor Cbt' may be provided as a portion of the first scan line SL1 and connected to the second gate electrode G2. The ninth electrode CE9 of the fifth storage capacitor Cbt' may overlap the eighth electrode CE8 and be provided as an oxide semiconductor. The ninth electrode CE9 may be arranged in the same layer as the third semiconductor layer of the third transistor T3 and the fourth semiconductor layer of the fourth transistor T4 and be a region disposed between the third semiconductor layer and the fourth semiconductor layer. Alternatively, the ninth electrode CE9 may extend from the fourth semiconductor layer. Alternatively, the ninth electrode CE9 may extend from the third semiconductor layer.

FIG. 12 shows cross-sections of portions corresponding to the first transistor T1, the fourth transistor T4, the fourth storage capacitor Cst4, and the fifth storage capacitor Cbt' shown in FIG. 11, and some members may be omitted.

The first gate electrode G1 of the first transistor T1, the second gate electrode G2 of the second transistor T2, the fifth gate electrode G5 of the fifth transistor T5, the sixth gate electrode G6 of the sixth transistor T6, and the seventh gate electrode G7 of the seventh transistor T7 may be arranged on the first gate insulating layer 112. In addition, the first scan line SL1 and the emission control line EL may be arranged on the first gate insulating layer 112. A portion of the first scan line SL1 may be the eighth electrode CE8 of the fifth storage capacitor Cbt'.

The first gate electrode G1 of the first transistor T1 serves as the sixth electrode CE6 of the fourth storage capacitor Cst4 as well as the control electrode of the first transistor T1.

The seventh electrode CE7 may be arranged on the second gate insulating layer 113 to overlap the sixth electrode CE6. The seventh electrode CE7 may include an opening SOP. The opening SOP is formed by removing a portion of the seventh electrode CE7 and may have a closed shape.

The second gate insulating layer 113 may serve as a dielectric layer of the fourth storage capacitor Cst4. The seventh electrodes CE7 of pixels that are adjacent to each other may be connected to each other by a bridge 141. The bridge 141 extends in the first direction (the x-direction) from the seventh electrode CE7 and may be formed as one body with the seventh electrode CE7.

The semiconductor layer AO may include the ninth electrode CE9 of the fifth storage capacitor Cbt'. The ninth electrode CE9 of the fifth storage capacitor Cbt' may be arranged between the third semiconductor layer AO3 of the third transistor T3 and the fourth semiconductor layer AO4 of the fourth transistor T4. The ninth electrode CE9 may extend from the third semiconductor layer AO3 of the third transistor T3 or the fourth semiconductor layer AO4 of the fourth transistor T4. That is, the ninth electrode CE9 may be provided as an oxide semiconductor and arranged on the first interlayer insulating layer 114. The second gate insulating layer 113 and the first interlayer insulating layer 114 are arranged between the eighth electrode CE8 and the ninth electrode CE9 of the fifth storage capacitor Cbt'. The second gate insulating layer 113 and the first interlayer insulating layer 114 may serve as dielectric layers of the fifth storage capacitor Cbt'.

The first power voltage line 172 may be electrically connected to the seventh electrode CE7 of the fourth storage capacitor Cst4 through the contact hole 64 (see FIG. 11) defined in the first interlayer insulating layer 114, the third gate insulating layer 115, and the second interlayer insulating layer 116. The first power voltage line 172 may be electrically connected to the fifth drain region D5 of the fifth transistor T5 through the contact hole 65 (see FIG. 11) defined in the first gate insulating layer 112, the second gate insulating layer 113, the first interlayer insulating layer 114, the third gate insulating layer 115, and the second interlayer insulating layer 116.

One end of the node connection line 171 may be electrically connected to the fourth drain region D4 of the fourth transistor T4, the third source region S3 of the third transistor T3, or the ninth electrode CE9 of the fifth storage capacitor Cbt' through the contact hole 61. The contact hole 61 may be defined in the third gate insulating layer 115 and the second interlayer insulating layer 116. Another end of the node connection line 171 may be electrically connected to the connection electrode 161 through the contact hole 62. The contact hole 62 may be defined in the second interlayer insulating layer 116. In addition, the connection electrode 161 may be electrically connected to the first gate electrode G1 through the contact hole 63. The contact hole 63 may be defined in the second gate insulating layer 113, the first interlayer insulating layer 114, and the third gate insulating layer 115. Accordingly, the ninth electrode CE9 of the fifth storage capacitor Cbt' may be electrically connected to the first gate electrode G1. When a first scan signal Sn supplied to the first scan line SL1 is turned off, the fifth storage capacitor Cbt' may raise the voltage of the node N2 (see FIG. 1) to clearly express a black grayscale.

Figure 13:
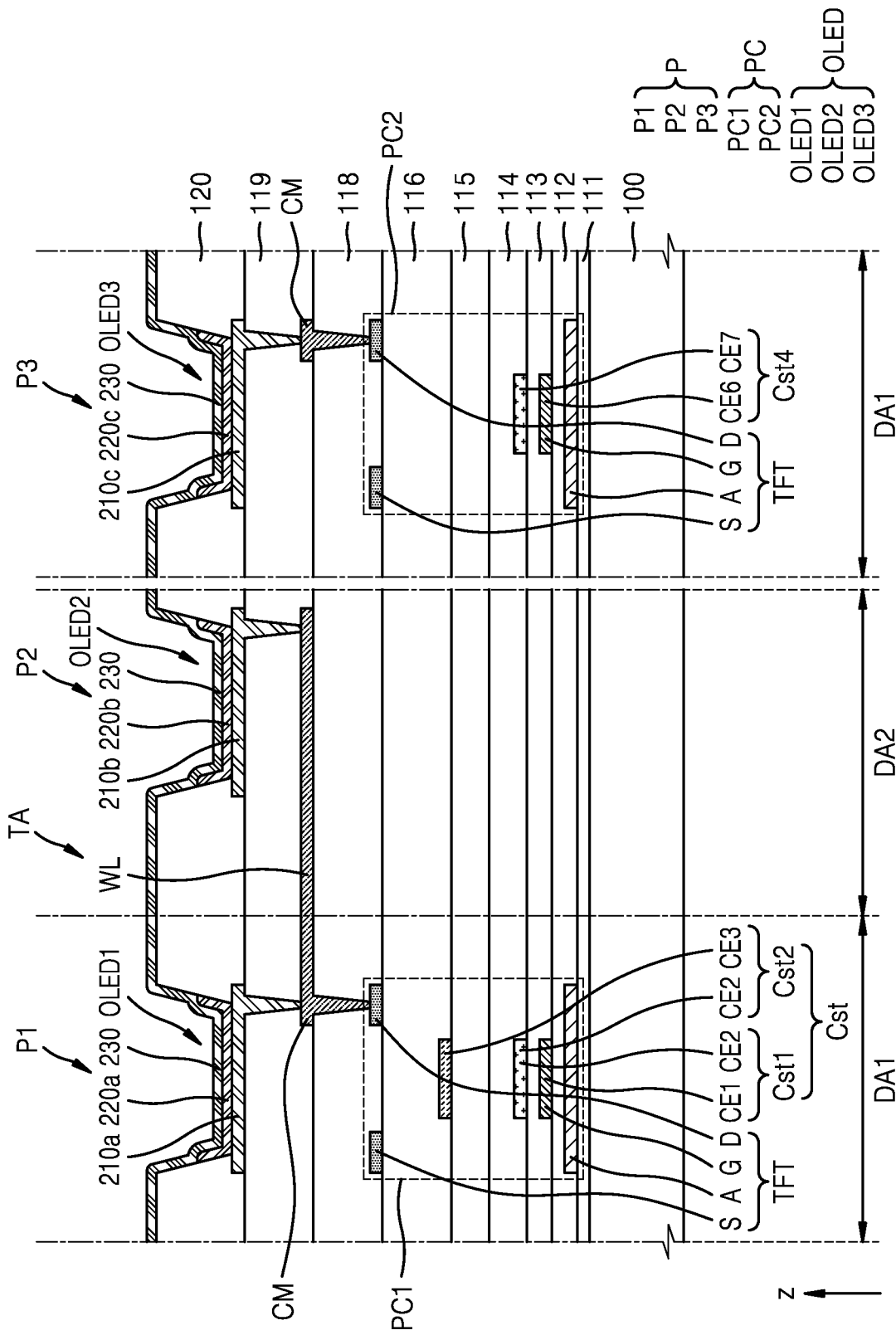
FIG. 13 is a cross-sectional view of a display apparatus according to an embodiment.

FIG. 13 is a cross-sectional view of a display apparatus according to an embodiment.

FIG. 13 shows the embodiment in which pixel circuits including the transistors and the storage capacitors are connected to an organic light-emitting diode OLED. In FIG. 13, the same reference numerals as those of the previous embodiments denote the same members, and thus, repeated descriptions thereof are omitted.

Referring to FIG. 13, in an embodiment, the pixel circuit PC may be arranged in the first area DA1. As an example, the first pixel circuit PC1 and the second pixel circuit PC2 described in FIGS. 6 to 12 may be arranged in the first area DA1.

In an embodiment, the first pixel circuit PC1 may overlap at least a portion of the first pixel P1. Alternatively, the first pixel circuit PC1 may overlap at least a portion of the first organic light-emitting diode OLED1 of the first pixel P1. The first pixel circuit PC1 may be electrically connected to both the first pixel P1 to drive the first pixel P1 and the second pixel P2 to drive the second pixel P2. Alternatively, the first pixel circuit PC1 may be electrically connected to both a first organic light-emitting diode OLED1 of the first pixel P1 to drive the first organic light-emitting diode OLED1 and the second organic light-emitting diode OLED2 of the second pixel P2 to drive the second organic light-emitting diode OLED2.

In an embodiment, the second pixel circuit PC2 may overlap at least a portion of the third pixel P3. Alternatively, the second pixel circuit PC2 may overlap at least a portion of a third organic light-emitting diode OLED3 of the third pixel P3. The second pixel circuit PC2 may be electrically connected to the third pixel P3 to drive the third pixel P3. Alternatively, the second pixel circuit PC2 may be electrically connected to the third organic light-emitting diode OLED3 of the third pixel P3 to drive the third organic light-emitting diode OLED3.

In an embodiment, the second pixel P2 may not overlap any pixel circuit in a plan view. That is, the pixel circuit PC may not be arranged below the second pixel P2 to overlap the second pixel P2. Specifically, a second organic light-emitting diode OLED of the second pixel P2 may not overlap the first pixel circuit PC1. Alternatively, the second organic light-emitting diode OLED2 of the second pixel P2 may not overlap the second pixel circuit PC2. That is, the pixel circuit PC connected to the second pixel P2 may not be arranged below the second organic light-emitting diode OLED of the second pixel P2 to overlap the second organic light-emitting diode OLED of the second pixel P2 in a plan view. Accordingly, because the pixel circuit configured to drive a pixel is not arranged below the second pixel P2 (or the second organic light-emitting diode OLED2 of the second pixel P2), a light transmittance of the second area DA2 may be improved.

Alternatively, in the case where a display apparatus 1' has a structure shown in FIGS. 4 and 5, the driving circuits, that is, the first scan driving circuit 11, the second scan driving circuit 12, and the emission control driving circuit 13 may be arranged below the second pixel P2 arranged in the second area DA2. The second pixel P2 arranged over the driving circuits, that is, the first scan driving circuit 11, the second scan driving circuit 12, and the emission control driving circuit 13 may receive a signal and/or a voltage from the first pixel circuit PC1 of the first pixel P1 arranged in the first area DA1 disposed adjacent to the second area DA2. Accordingly, the pixel (e.g. the second pixel P2) may be arranged in the region (e.g. the second area DA2) in which the driving circuits, that is, the first scan driving circuit 11, the second scan driving circuit 12, and the emission control driving circuit 13 are arranged. Because the pixel (e.g. the second pixel P2) arranged in the second area DA2 is driven by receiving a signal and/or a voltage from the pixel circuit (e.g. the first pixel circuit PC1) arranged in the first area DA1, an image may be displayed even in the region (e.g. the second area DA2) in which the driving circuits, that is, the first scan driving circuit 11, the second scan driving circuit 12, and the emission control driving circuit 13 are arranged. That is, the display area DA of the display apparatus 1' may maximally extend in one direction (e.g. the x-direction), and a full-screen display may be implemented when viewed from the front.

The first pixel circuit PC1 and the second pixel circuit PC2 of FIG. 13 show the above-described embodiments. Specifically, the first pixel circuit PC1 of FIG. 13 may have the structure shown in FIGS. 6 to 9. In addition, the second pixel circuit PC2 of FIG. 13 may have the structure shown in FIGS. 10 to 12. However, the embodiment is not limited thereto.

In an embodiment, the first pixel circuit PC1 may include a thin-film transistor TFT and a storage capacitor Cst. As an example, the thin-film transistor TFT of the first pixel circuit PC1 may be the first transistor T1 described with reference to FIGS. 6 to 9. However, the embodiment is not limited thereto.

In an embodiment, the thin-film transistor TFT may include a semiconductor layer A, a gate electrode G, a source electrode S, and a drain electrode D. In addition, the storage capacitor Cst may include a first storage capacitor Cst1 and a second storage capacitor Cst2 that are connected in parallel to each other.

In an embodiment, an organic light-emitting diode OLED may be arranged over the pixel circuit PC. The organic light-emitting diode OLED may be connected to the pixel circuit PC to emit red, green, blue, or white light. The pixel P including the organic light-emitting diode OLED may be electrically connected to the pixel circuit PC arranged therebelow, and thus, be driven.

In an embodiment, organic light-emitting diodes, that is, the first to third organic light-emitting diodes OLED1, OLED2, and OLED3 may respectively include pixel electrodes, that is, first to third pixel electrodes 210a, 210b, and 210c, intermediate layers, that is, first to third intermediate layers 220a, 220b, and 220c, and an opposite electrode 230. In detail, the first organic light-emitting diode OLED1 may include the first pixel electrode 210a, the first intermediate layer 220a, and the opposite electrode 230. The second organic light-emitting diode OLED2 may include the second pixel electrode 210b, the second intermediate layer 220b, and the opposite electrode 230. The third organic light-emitting diode OLED3 may include the third pixel electrode 210c, the third intermediate layer 220c, and the opposite electrode 230.

A pixel-defining layer 120 may be arranged on the second planarization layer 119. The pixel-defining layer 120 defines emission areas by including openings respectively corresponding to the pixels, that is, openings that respectively expose the central portions of the pixel electrodes 210a, 210b, and 210c. In addition, the pixel-defining layer 120 prevents an arc, etc. from occurring at the edges of the pixel electrodes, that is, the first to third pixel electrodes 210a, 210b, and 210c, by increasing a distance between the edges of the pixel electrodes, that is, the first to third pixel electrodes 210a, 210b, and 210c and the opposite electrode 230 over the pixel electrodes, that is, the first to third pixel electrodes 210a, 210b, and 210c. The pixel-defining layer 120 may include an organic material, for example, polyimide or hexamethyldisiloxane (HMDSO).

The intermediate layers, that is, the first to third intermediate layers 220a, 220b, and 220c of the organic light-emitting diodes, that is, the first to third organic light-emitting diodes OLED1, OLED2, and OLED3, may include a low-molecular weight material or a polymer material. In the case where the intermediate layers includes a low molecular weight material, the intermediate layers may have a structure in which a hole injection layer (HIL), a hole transport layer (HTL), an emission layer (EML), an electron transport layer (ETL), an electron injection layer (EIL), etc. are stacked in a single or composite configuration. The intermediate layers may include various organic materials such as copper phthalocyanine (CuPc), N,N'-Di (naphthalene-1-yl)-N,N'-diphenyl-benzidine (NPB), and tris-8-hydroxyquinoline aluminum (Alq3). These layers may be formed by vacuum deposition.

In the case where the intermediate layers, that is, the first to third intermediate layers 220a, 220b, and 220c, include a polymer material, the first to third intermediate layers 220a, 220b, and 220c may have a structure including an HTL and an EML. In this case, the HTL may include poly (3,4-ethylenedioxythiophene) (PEDOT), and the EML may include a polymer material such as a polyphenylene vinylene (PPV)-based material and a polyfluorene-based material. The intermediate layers, that is, the first to third intermediate layers 220a, 220b, and 220c may be formed through screen printing, an inkjet printing method, or a laser induced thermal imaging.

The intermediate layers, that is, the first to third intermediate layers 220a, 220b, and 220c, may not be limited thereto and may have various structures. The intermediate layers, that is, the first to third intermediate layers 220a, 220b, and 220c, may include a layer which is one body over a plurality of pixel electrodes, that is, the first to third pixel electrodes 210a, 210b, and 210c, or include a layer patterned to respectively correspond to the plurality of pixel electrodes, that is, the first to third pixel electrodes 210a, 210b, and 210c.

The opposite electrode 230 may be formed as one body over the plurality of organic light-emitting diodes to correspond to the plurality of pixel electrodes, that is, the first to third pixel electrodes 210a, 210b, and 210c.

In an embodiment, the first organic light-emitting diode OLED1 may be arranged over the first pixel circuit PC1. As an example, the first pixel circuit PC1 may overlap at least a portion of the first organic light-emitting diode OLED1. In addition, because the first organic light-emitting diode OLED1 includes the first pixel electrode 210a, the first pixel electrode 210a may overlap at least a portion of the first pixel circuit PC1.

In an embodiment, the first organic light-emitting diode OLED1 may be electrically connected to the first pixel circuit PC1 to emit red, green, blue, or white light. As an example, the first pixel circuit PC1 may be electrically connected to the first pixel electrode 210a of the first organic light-emitting diode OLED1 through a contact electrode CM arranged on the first planarization layer 118.

In an embodiment, the third organic light-emitting diode OLED3 may be arranged over the second pixel circuit PC2. As an example, the second pixel circuit PC2 may overlap at least a portion of the third organic light-emitting diode OLED3. In addition, because the third organic light-emitting diode OLED3 includes the third pixel electrode 210*c*, the third pixel electrode 210*c* may overlap at least a portion of the second pixel circuit PC2.

In an embodiment, the third organic light-emitting diode OLED3 may be electrically connected to the second pixel circuit PC2 to emit red, green, blue, or white light. As an example, the second pixel circuit PC2 may be electrically connected to the third pixel electrode 210*c* of the third organic light-emitting diode OLED3 through a contact electrode CM arranged on the first planarization layer 118.

In an embodiment, a pixel circuit may not be arranged below the second organic light-emitting diode OLED2. In addition, because the second organic light-emitting diode OLED2 includes the second pixel electrode 210*b*, the second pixel electrode 210*b* may not overlap any pixel circuit PC.

In an embodiment, the second organic light-emitting diode OLED2 may be driven by being connected to the pixel circuit PC arranged in a region disposed adjacent the second organic light-emitting diode OLED2. Specifically, the second organic light-emitting diode OLED2 arranged in the second area DA2 may be driven by being connected to the first pixel circuit PC1 arranged in the first area DA1 adjacent thereto.

The second organic light-emitting diode OLED2 does not overlap the first pixel circuit PC1 which is connected to the second organic light-emitting diode OLED2 but is connected to the first pixel circuit PC1 which is disposed in the first display area DA1 through a connection wiring WL. Accordingly, the second organic light-emitting diode OLED2 may be driven by the first pixel circuit PC1. As an example, the second pixel electrode 210*b* of the second organic light-emitting diode OLED2 may be connected to the first pixel circuit PC1 through the connection wiring WL. Accordingly, the second organic light-emitting diode OLED2 may be driven by the first pixel circuit PC1.

In an embodiment, the connection wiring WL may include a transparent conductive material. As an example, the connection wiring WL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). As an example, because the connection wiring WL includes a transparent conductive material having a high transmittance, even though the connection wiring WL is arranged in the transmission area TA, a transmittance of the transmission area TA may be secured.

Alternatively, in an embodiment, the connection wiring WL may include a conductive material including molybdenum (Mo), copper (Cu), and titanium (Ti) and include a single layer or a multi-layer including the above materials.

In an embodiment, the connection wiring WL may include a first portion and a second portion, the first portion including a transparent conductive material, and the second portion including a conductive material. In this case, the first portion may be arranged in the second area DA2, and the second portion may be arranged in the first area DA1. In an embodiment, the first portion and the second portion may be arranged in the same layer. Alternatively, the first portion and the second portion may be arranged in different layers.

In the case where the first portion and the second portion are arranged in different layers, the first portion may be connected to the second portion through a contact hole.

In an embodiment, the connection wiring WL may be arranged on the first planarization layer 118. However, the embodiment is not limited thereto. In an embodiment, the connection wiring WL may be arranged on the buffer layer 111, arranged on the first gate insulating layer 112, arranged on the second gate insulating layer 113, arranged on the first interlayer insulating layer 114, arranged on the third gate insulating layer 115, or arranged on the second interlayer insulating layer 116. However, various modifications may be made. Alternatively, the first pixel electrode 210*a* of the first pixel P1 may extend to the second area DA2 to serve as the connection wiring WL. This is described with reference to FIG. 14.

In an embodiment, the buffer layer 111, the first gate insulating layer 112, the second gate insulating layer 113, the first interlayer insulating layer 114, the third gate insulating layer 115, the second interlayer insulating layer 116, the first planarization layer 118, the second planarization layer 119, and the pixel-defining layer 120 may be sequentially arranged in the transmission area TA. However, the embodiment is not limited thereto. In an embodiment, at least one of the buffer layer 111, the first gate insulating layer 112, the second gate insulating layer 113, the first interlayer insulating layer 114, the third gate insulating layer 115, the second interlayer insulating layer 116, the first planarization layer 118, and the second planarization layer 119 may include an opening or a hole corresponding to the transmission area TA. That is, the at least one of the buffer layer 111, the first gate insulating layer 112, the second gate insulating layer 113, the first interlayer insulating layer 114, the third gate insulating layer 115, the second interlayer insulating layer 116, the first planarization layer 118, and the second planarization layer 119 may not be arranged in the transmission area TA.

In an embodiment, the first gate insulating layer 112, the second gate insulating layer 113, the first interlayer insulating layer 114, the third gate insulating layer 115, and the second interlayer insulating layer 116, which are inorganic insulating layers, may include an opening corresponding to the transmission area TA. That is, the first gate insulating layer 112, the second gate insulating layer 113, the first interlayer insulating layer 114, the third gate insulating layer 115, and the second interlayer insulating layer 116, which are inorganic insulating layers, may not be arranged in the transmission area TA. Because the inorganic insulating layers are removed from the transmission area TA, a light transmittance of the transmission area TA may be improved.

Alternatively, in an embodiment, the buffer layer 111 as well as the inorganic insulating layers may not be arranged inside the transmission area TA. Alternatively, in an embodiment, the first planarization layer 118 and the second planarization layer 119, which are organic insulating layers, may include an opening corresponding to the transmission area TA. That is, the organic insulating layers may not be arranged inside the transmission area TA.

Figure 14:
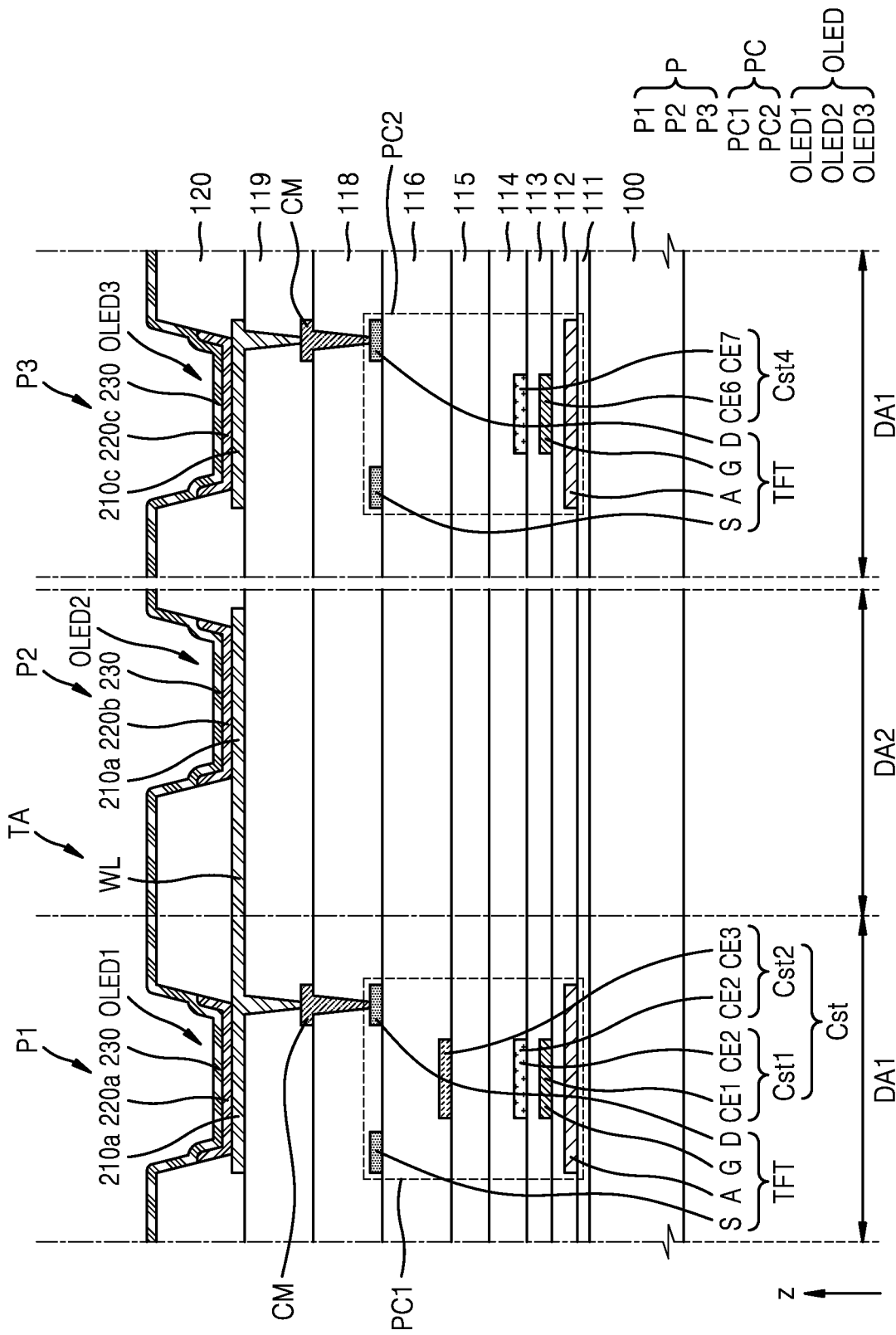
FIG. 14 is a cross-sectional view of a display apparatus according to an embodiment.

FIG. 14 is a cross-sectional view of a display apparatus according to an embodiment. The embodiment of FIG. 14 is different from the embodiment of FIG. 13 in that the first pixel circuit PC1 is electrically connected to the second pixel P2 through the first pixel electrode 210*a*. In FIG. 14, the same reference numerals as those of FIG. 13 denote the same members, and thus, repeated descriptions thereof are omitted.

Referring to FIG. 14, the first pixel P1 may include the first organic light-emitting diode OLED1, and the first organic light-emitting diode OLED1 may include the first pixel electrode 210a, the first intermediate layer 220a, and the opposite electrode 230. The first pixel circuit PC1 may be arranged below the first pixel P1. As an example, the first pixel P1 may overlap at least a portion of the first pixel circuit PC1. The first pixel P1 may be driven by being electrically connected to the first pixel circuit PC1 arranged therebelow. As an example, because the first pixel electrode 210a of the first organic light-emitting diode OLED1 may be electrically connected to the first pixel circuit PC1, the first organic light-emitting diode OLED1 may be driven.

In an embodiment, the first pixel electrode 210a may be arranged in the first area DA1. In an embodiment, at least a portion of the first pixel electrode 210a arranged in the first area DA1 may extend to the second area DA2. That is, the first pixel electrode 210a may be arranged in both the first area DA1 and the second area DA2.

In an embodiment, the first organic light-emitting diode OLED1 and the second organic light-emitting diode OLED2 may share a pixel electrode (e.g. the first pixel electrode 210a). Accordingly, the first organic light-emitting diode OLED1 may include the first pixel electrode 210a, the first intermediate layer 220a, and the opposite electrode 230. The second organic light-emitting diode OLED2 may include the first pixel electrode 210a, the second intermediate layer 220b, and the opposite electrode 230.

In an embodiment, because a pixel circuit is not arranged below the second organic light-emitting diode OLED2, the second organic light-emitting diode OLED2 may be electrically connected to the first pixel circuit PC1 arranged in the first area DA1 through the first pixel electrode 210a. That is, the first pixel electrode 210a may serve as the connection wiring WL connecting the second organic light-emitting diode OLED2 to the first pixel circuit PC1 as well as serve as anodes of the first organic light-emitting diode OLED1 and the second organic light-emitting diode OLED2.

FIG. 15 is a table showing measurement results of a current (a driving current) according to a capacitance of a storage capacitor. An embodiment of FIG. 15 is a table showing measurement results of a current (a driving current) when a capacitance of a capacitor is increased while a voltage is fixed in a pixel circuit including seven transistors and one capacitor.

Referring to FIG. 15, it is shown that, when a capacitance of a storage capacitor increases, a current (a driving current) increases. Specifically, it is shown that, when a capacitance of the storage capacitor increases, a current flowing in a direction of an organic light-emitting diode that emits red, green, or blue light increases.

As an example, in the case where a capacitance increases from about 63.25 F to about 90 F, the current (the driving current) increases by about twice. Accordingly, when a capacitance of the storage capacitor is increased by about 1.5 times, the current (the driving current) may be increased by about twice.

In an embodiment, because at least two or more pixels are driven by using one pixel circuit, a transmittance of the second area DA2 may be improved, and a full-screen display may be implemented when viewed from the front.

Specifically, because at least two or more pixels are driven by using one pixel circuit, a pixel circuit may not be arranged in the second area DA2, and thus, a transmittance of the second area DA2 may be improved. Also, in this case, pixels may be arranged in the second area DA2 in which the driving circuits, that is, the first scan driving circuit 11, the second scan driving circuit 12, and the emission control driving circuit 13 are arranged. Accordingly, a full-screen display may be implemented when viewed from the front.

However, in the case where a plurality of pixels are driven by using one pixel circuit, an amount of current applied to each pixel may be reduced and the brightness of each pixel may be reduced compared to the case where one pixel is driven by using one pixel circuit. That is, in the case where a plurality of pixels are driven by using one pixel circuit, a resolution of the display apparatus may be lower than a resolution of the case where one pixel is driven by using one pixel circuit.

In contrast, in an embodiment, in the case where a plurality of pixels are driven by using one pixel circuit, because the pixel circuit includes a storage capacitor Cst in which a first storage capacitor Cst1 is connected in parallel to a second storage capacitor Cst2, a capacitance (a total capacitance) of the storage capacitor Cst may be increased. In addition, because a capacitance (a total capacitance) of the storage capacitor Cst is increased, a current (a driving current) flowing to each pixel increases and the brightness of each pixel may be increased. Accordingly, the resolutions of the display apparatuses 1 and 1' may be improved.

Specifically, as described above, the first pixel circuit PC1 that simultaneously drives at least one first pixel P1 and at least one second pixel P2 may include the storage capacitor Cst in which the first storage capacitor Cst1 is connected in parallel to the second storage capacitor Cst2. Because the first pixel circuit PC1 includes the storage capacitor Cst in which the first storage capacitor Cst1 is connected in parallel to the second storage capacitor Cst2, a capacitance (a total capacitance) of the storage capacitor Cst may be increased, and thus, the current (the driving current) flowing to each pixel (e.g., the first pixel P1 and the second pixel P2) may be increased. Accordingly, because the current (the driving current) flowing to each pixel (e.g., the first pixel P1 and the second pixel P2) increases, the brightness and the resolution of each pixel (e.g., the first pixel P1 and the second pixel P2) may be increased. However, because the first pixel circuit PC1 includes the third storage capacitor Cbt, which is a boosting capacitor, a voltage (a black voltage) that displays black may be reduced.

In addition, because the second pixel circuit PC2 drives only one third pixel P3, the second pixel circuit PC2 may not need two storage capacitors that are connected in parallel to each other but need only one storage capacitor. The second pixel circuit PC2 may also include the third storage capacitor Cbt which is the boosting capacitor.

In addition, because the first pixel circuit PC1 that drives the first pixel P1 and the second pixel P2 includes storage capacitors Cst that are connected in parallel to each other, the area of the first pixel circuit PC1 may be the same as the area of the second pixel circuit PC2 that drives the third pixel P3. That is, because the first pixel circuit PC1 and the second pixel circuit PC2 may be provided in the same size, a high-resolution display apparatus may be implemented.

In an embodiment, a first thin-film transistor may be the first transistor T1 of the first pixel circuit PC1. However, the embodiment is not limited thereto. As an example, the first thin-film transistor may be one of the second transistor T2, the fifth transistor T5, the sixth transistor T6, and the seventh transistor T7 of the first pixel circuit PC1.

In an embodiment, a second thin-film transistor may be the third transistor T3 of the first pixel circuit PC2. However, the embodiment is not limited thereto. As an example, the second thin-film transistor may be the fourth transistor T4 of the first pixel circuit PC1.

In an embodiment, a first semiconductor layer of the first thin-film transistor may include a silicon semiconductor, and a second semiconductor layer of the second thin-film transistor may include a silicon semiconductor.

In an embodiment, a first gate electrode of the first thin-film transistor may be one of gate electrodes G1, G2, G5, G6, and G7. As an example, the first gate electrode of the first thin-film transistor may be the gate electrode G1.

In an embodiment, a second gate electrode of the second thin-film transistor may be at least one of the gate electrodes G3 and G4. Specifically, the second gate electrode of the second thin-film transistor may be at least one of the upper gate electrodes G3b and G4b.

In an embodiment, a third gate electrode of the second thin-film transistor may be at least one of the gate electrodes G3 and G4. Specifically, the third gate electrode of the second thin-film transistor may be at least one of the lower gate electrodes G3a and G4a.

According to an embodiment, a display apparatus in which a plurality of pixels may be driven by using one pixel circuit may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate including a first area and a second area disposed adjacent to the first area;
a first pixel arranged in the first area;
a first pixel circuit arranged in the first area, electrically connected to the first pixel, and overlapping at least a portion of the first pixel; and
a second pixel arranged in the second area and electrically connected to the first pixel circuit,
wherein the first pixel circuit comprises a first storage capacitor and a second storage capacitor that are connected in parallel to each other between a driving voltage line and a gate electrode of a first thin-film transistor,
wherein the first storage capacitor comprises a first electrode and a second electrode disposed on the first electrode and at least partially overlapping with the first electrode,
wherein the second storage capacitor comprises the second electrode and a third electrode disposed on the second electrode and at least partially overlapping with the second electrode, and
wherein the first pixel circuit comprises:
the first thin-film transistor comprising the first gate electrode and a first semiconductor layer, the first gate electrode being arranged in a same layer as the first electrode and the first semiconductor layer being arranged below the first gate electrode; and
a second thin-film transistor comprising a second gate electrode and a second semiconductor layer, the second gate electrode being arranged in a same layer as the third electrode and the second semiconductor layer being arranged below the second gate electrode.

2. The display apparatus of claim 1, wherein the first electrode is electrically connected to the third electrode.

3. The display apparatus of claim 2, wherein the second thin-film transistor further comprises a third gate electrode arranged below the second semiconductor layer.

4. The display apparatus of claim 3, wherein the first semiconductor layer and the second semiconductor layer are arranged in different layers.

5. The display apparatus of claim 4, wherein the first semiconductor layer comprises a silicon semiconductor and the second semiconductor layer comprises an oxide semiconductor.

6. The display apparatus of claim 5, wherein the first pixel circuit further comprises a third storage capacitor, and
wherein the third storage capacitor comprises a fourth electrode and a fifth electrode which overlap each other with at least one insulating layer interposed therebetween.

7. The display apparatus of claim 6, wherein the fourth electrode is arranged in a same layer as the first electrode and the fifth electrode is arranged in a same layer as the second semiconductor layer.

8. The display apparatus of claim 1, wherein the third electrode is electrically connected to the second semiconductor layer through a connection electrode.

9. The display apparatus of claim 1, wherein the second pixel does not overlap the first pixel circuit.

10. The display apparatus of claim 9, wherein the second pixel is connected to the first pixel circuit through a connection wiring.

11. The display apparatus of claim 1, further comprising:
a third pixel arranged in the first area; and
a second pixel circuit arranged in the first area, electrically connected to the third pixel, and overlapping at least a portion of the third pixel.

12. A display apparatus comprising:
a substrate including a first area and a second area disposed adjacent to the first area; and
a first pixel circuit arranged in the first area and comprising a first semiconductor layer and a second semiconductor layer arranged in different layers,
wherein the first pixel circuit comprises a first storage capacitor and a second storage capacitor which are connected in parallel to each other between a driving voltage line and a first gate electrode of a first thin-film transistor,
wherein the first storage capacitor comprises a first electrode and a second electrode disposed on the first electrode and at least partially overlapping with the first electrode,
wherein the second storage capacitor comprises the second electrode and a third electrode disposed on the second electrode and at least partially overlapping with the second electrode, and
wherein the first pixel circuit comprises:
the first thin-film transistor comprising the first gate electrode and the first semiconductor layer, the first gate electrode being arranged in a same layer as the first electrode and the first semiconductor layer being arranged below the first gate electrode; and
a second thin-film transistor comprising a second gate electrode and the second semiconductor layer, the second gate electrode being arranged in a same layer as the third electrode and the second semiconductor layer being arranged below the second gate electrode.

13. The display apparatus of claim 12, further comprising a first pixel arranged in the first area, wherein the first pixel is electrically connected to the first pixel circuit and overlaps at least a portion of the first pixel circuit.

14. The display apparatus of claim 12, further comprising a second pixel arranged in the second area,
wherein the second pixel is electrically connected to the first pixel circuit and the second pixel does not overlap at least a portion of the first pixel circuit.

15. The display apparatus of claim 12, further comprising a third pixel arranged in the first area and a second pixel circuit electrically connected to the third pixel,
wherein the third pixel overlaps at least a portion of the second pixel circuit.

16. The display apparatus of claim 12, wherein the first semiconductor layer comprises a silicon semiconductor and the second semiconductor layer comprises an oxide semiconductor.

* * * * *